(12) United States Patent
Staunton et al.

(10) Patent No.: US 9,957,116 B2
(45) Date of Patent: May 1, 2018

(54) METHOD FOR PROVIDING VACUUM TO A MOVING ELEMENT

(71) Applicant: ATS AUTOMATION TOOLING SYSTEMS INC., Cambridge (CA)

(72) Inventors: Darragh Staunton, Kochel am See (DE); Albert Kleinikkink, Kitchener (CA)

(73) Assignee: ATS Automation Tooling Systems Inc., Cambridge (CA)

( * ) Notice: Subject to any disclaimer, the term of this patent is extended or adjusted under 35 U.S.C. 154(b) by 81 days.

(21) Appl. No.: 15/244,392

(22) Filed: Aug. 23, 2016

(65) Prior Publication Data

US 2017/0225908 A1 Aug. 10, 2017

Related U.S. Application Data

(63) Continuation of application No. 13/632,755, filed on Oct. 1, 2012, now Pat. No. 9,422,121.
(Continued)

(51) Int. Cl.
*B65G 47/91* (2006.01)
*B65G 54/02* (2006.01)
(Continued)

(52) U.S. Cl.
CPC ............ *B65G 47/91* (2013.01); *B65G 35/06* (2013.01); *B65G 47/912* (2013.01); *B65G 54/02* (2013.01); *H01L 21/67709* (2013.01)

(58) Field of Classification Search
CPC ............................... B65G 47/912; B65G 47/91
See application file for complete search history.

(56) References Cited

U.S. PATENT DOCUMENTS 5,450,939 A 9/1995 Myers
6,032,997 A 3/2000 Elliott
(Continued)

FOREIGN PATENT DOCUMENTS

DE 4126454 2/1993
DE 4310237 10/1993
(Continued)

OTHER PUBLICATIONS

Canadian Intellectual Property Office as International Searching Authority, International Search Report and Written Opinion on PCT Appln. No. PCT/CA2012/050687, dated Jan. 3, 2013.
(Continued)

*Primary Examiner* — Gerald McClain
(74) *Attorney, Agent, or Firm* — Gowling WLG (Canada) LLP; Neil Henderson

(57) ABSTRACT

A system for providing vacuum to a moving element of a transport system, the system includes: a vacuum chamber on the moving element for storing vacuum; a vacuum source; a vacuum inlet provided on the vacuum chamber and for connection to the vacuum source; and a vacuum outlet in communication with the vacuum chamber and positioned on the moving element. The vacuum source may be provided on and travel with the moving element or on the transport system and periodically engage with the vacuum chamber. Where the vacuum source is provided on the moving element, a vacuum chamber may not be required. Further, the vacuum source may be driven by electrical energy and/or mechanical energy in various configurations.

5 Claims, 32 Drawing Sheets

Related U.S. Application Data

(60) Provisional application No. 61/541,423, filed on Sep. 30, 2011.

(51) Int. Cl.
  *B65G 35/06* (2006.01)
  *H01L 21/677* (2006.01)

(56) References Cited

U.S. PATENT DOCUMENTS

| | | | |
|---|---|---|---|
| 6,164,633 | A | 12/2000 | Mulligan |
| 6,183,186 | B1 | 2/2001 | Howells et al. |
| 6,203,621 | B1 | 3/2001 | Tran et al. |
| RE39,747 | E | 7/2007 | Peltier |
| 2005/0061195 | A1 | 3/2005 | Lutz et al. |
| 2007/0289476 | A1 | 12/2007 | Schemm et al. |
| 2008/0174076 | A1* | 7/2008 | Eisele .............. B65G 47/1421 279/3 |
| 2008/0277885 | A1* | 11/2008 | Duff .................. H01L 21/67109 414/222.11 |

FOREIGN PATENT DOCUMENTS

| | | | |
|---|---|---|---|
| DE | 4310237 A1 * | 10/1993 | ............. B65G 47/91 |
| EP | 0361340 * | 4/1990 | |
| EP | 1892204 | 2/2008 | |
| GB | 2462681 | 2/2010 | |
| JP | H0429506 | 1/1992 | |
| JP | 5137203 | 6/1993 | |
| JP | H05330653 | 12/1993 | |
| JP | 7203735 | 8/1995 | |
| JP | 2002-104656 | 4/2002 | |
| WO | 2010099610 | 9/2010 | |
| WO | 2011100204 | 8/2011 | |

OTHER PUBLICATIONS

European Patent Office, Extended European Search Report on EP Appln. No. 12835740.7, dated Mar. 24, 2015.
State Intellectual Property Office of China, Office Action on Chinese Appln. No. 201280046899, dated Apr. 3, 2015.
European Patent Office, Extended European Search Report on European Appln. No. 12765949.8, dated Mar. 10, 2015.
European Patent Office, English translation of Abstract for German Appln. No. 4126454.
Japan Platform for Patent Information, English translation of Abstract for Japanese Appln. No. 2002-104656.
Japan Platform for Patent Information, English translation of Abstract for Japanese Appln. No. H04-029506.
European Patent Office, Examination Report on European Appln. No. 12835740.7, dated Apr. 21, 2016.
United States Patent and Trademark Office, Office Action on U.S. Appl. No. 13/632,755, dated Sep. 12, 2014.
United States Patent and Trademark Office, Final Office Action on U.S. Appl. No. 13/632,755, dated Apr. 1, 2015.
United States Patent and Trademark Office, Office Action on U.S. Appl. No. 13/632,755, dated Oct. 15, 2015.
European Patent Office, English translation of Abstract for European Patent No. 1892204.
Japan Platform for Patent Information, English translation of Abstract for Japanese Patent Appln. No. H05330653.

* cited by examiner

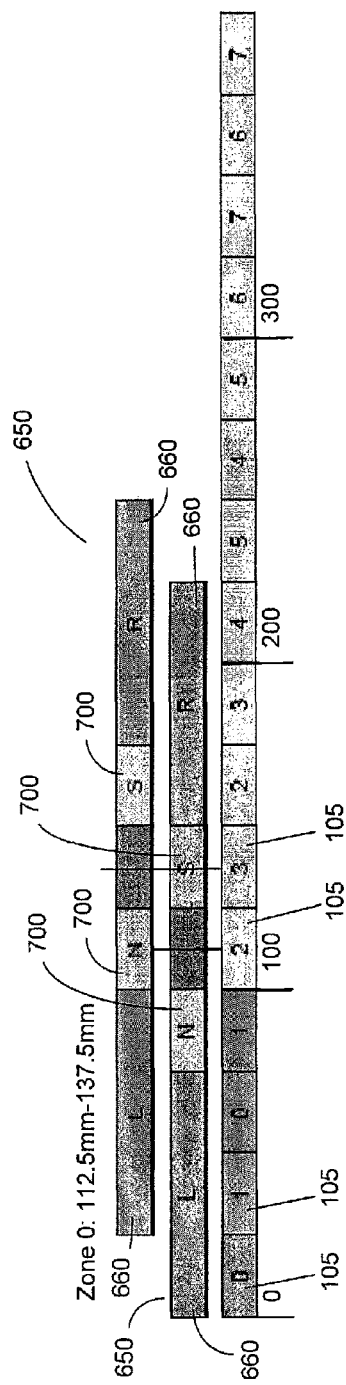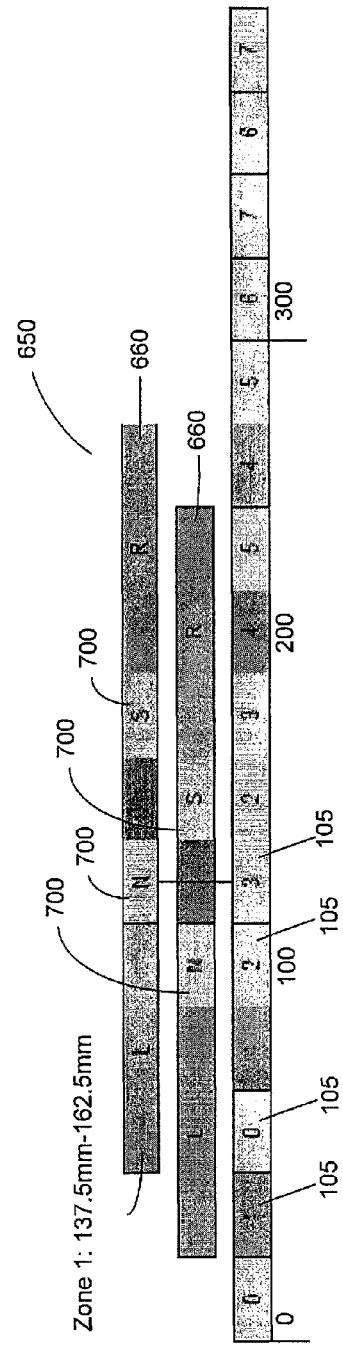
FIG. 12A
FIG. 12B

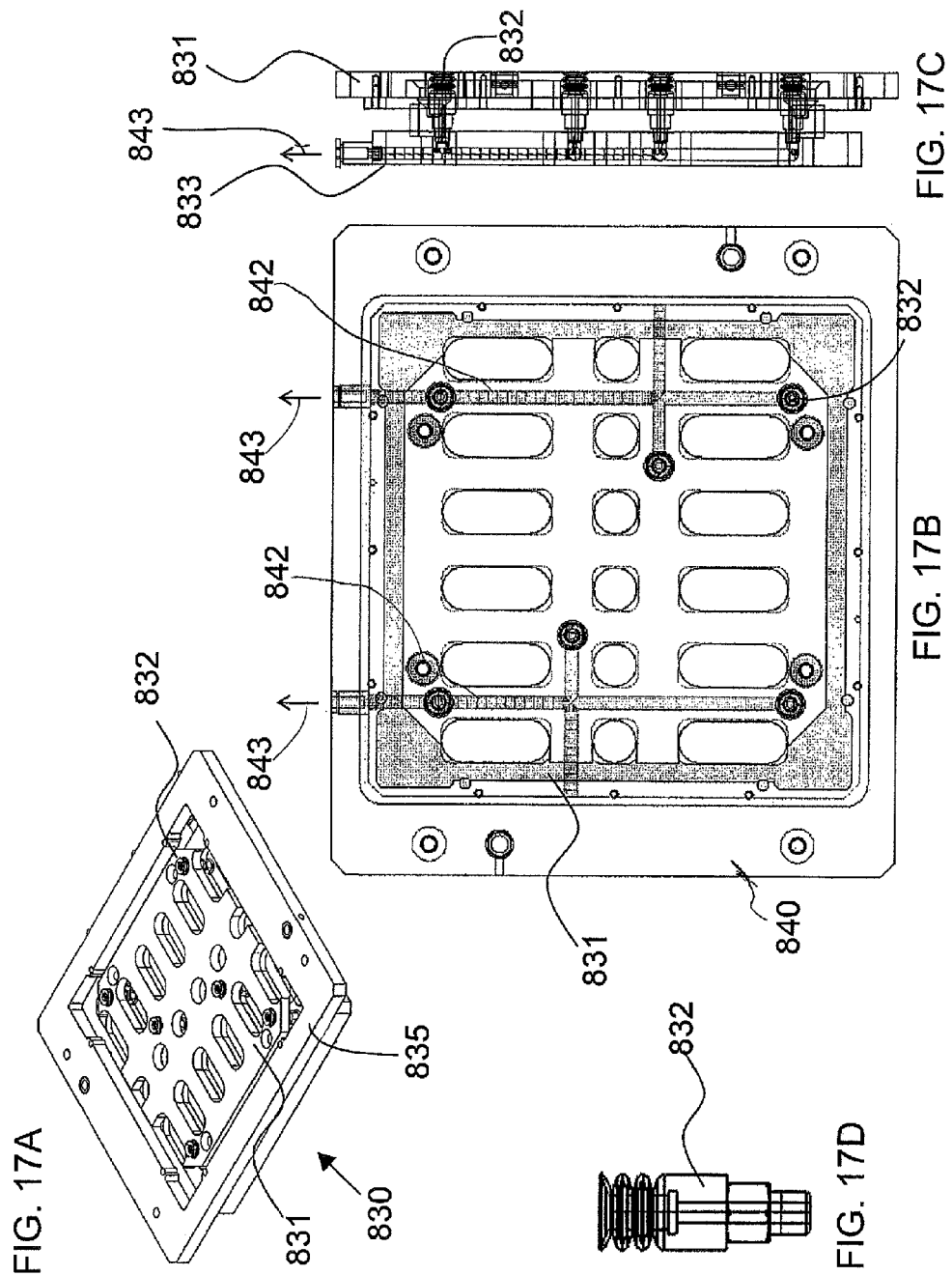

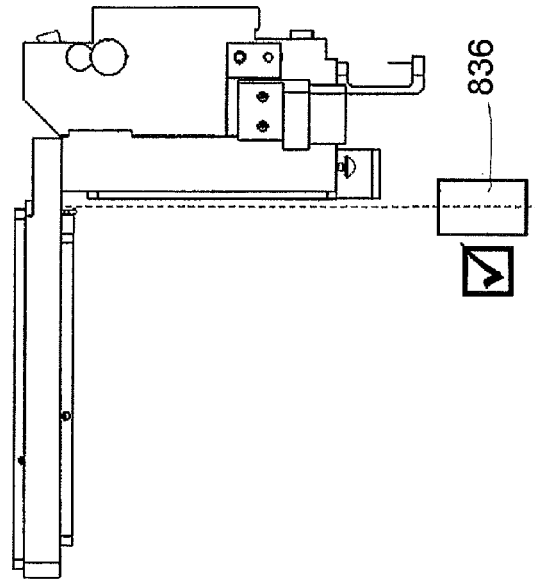
FIG. 18A  No Vacuum
FIG. 18B  Vacuum OK
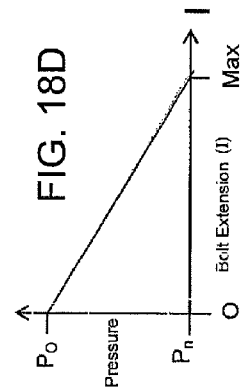
FIG. 18D
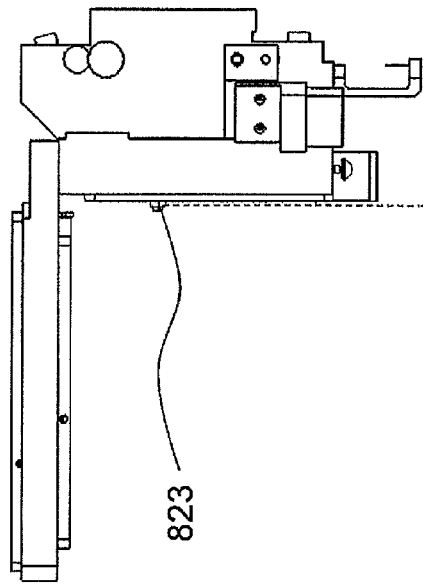
FIG. 18C

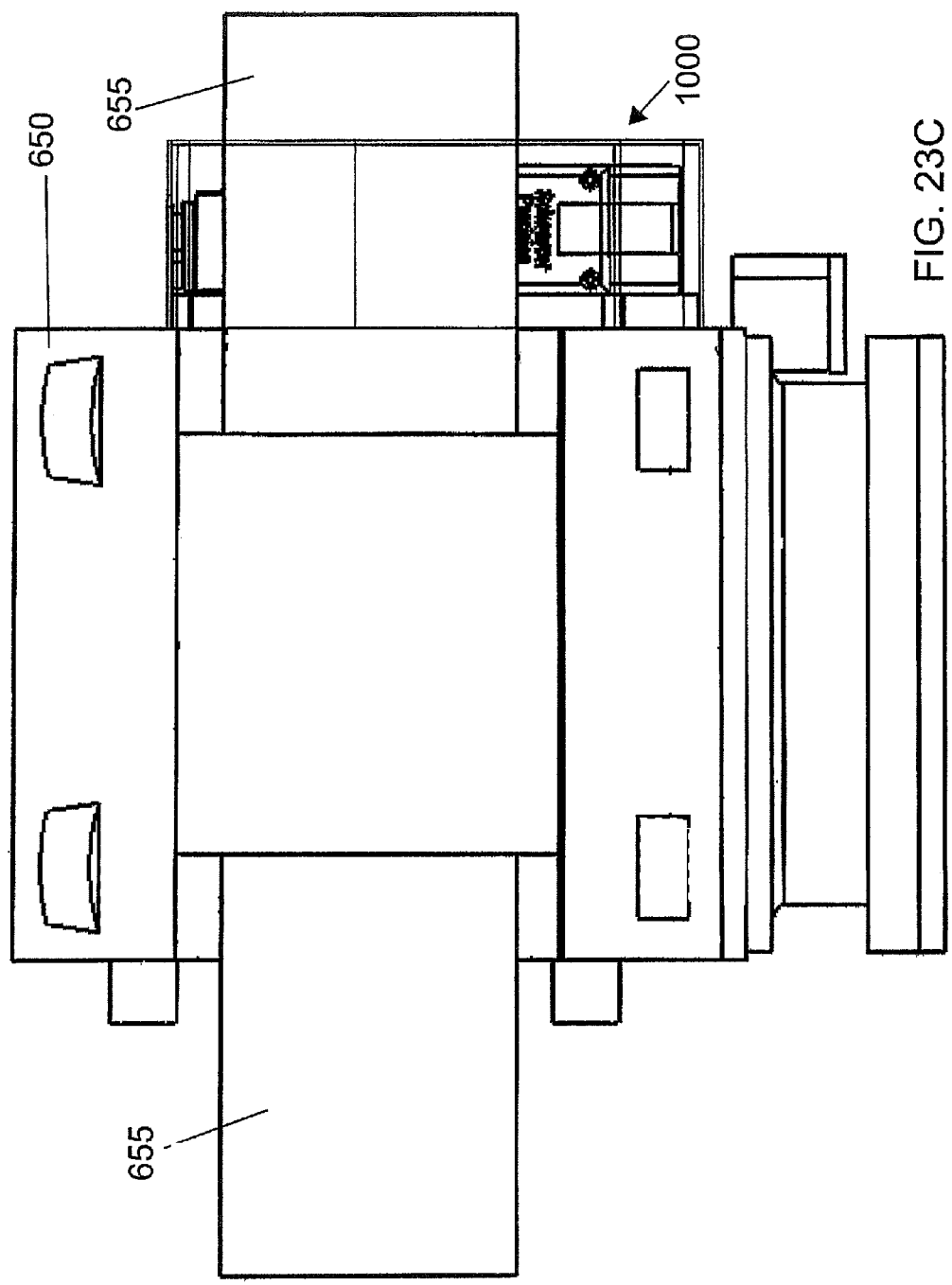

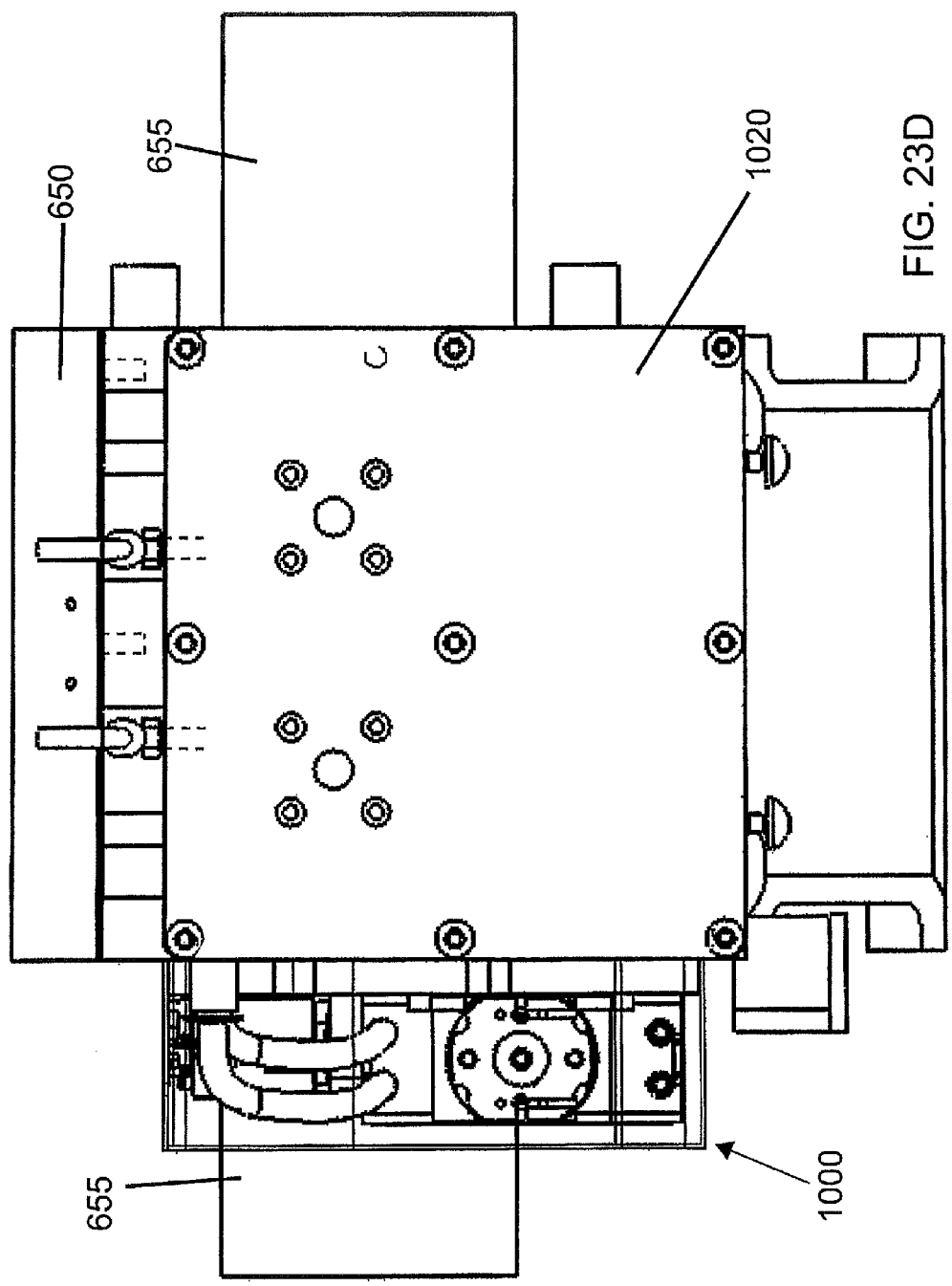

METHOD FOR PROVIDING VACUUM TO A MOVING ELEMENT

CROSS REFERENCE TO RELATED APPLICATIONS

This application is a continuation of U.S. patent application Ser. No. 13/632,755 filed Oct. 1, 2012 which claims the benefit of priority of U.S. Provisional Patent Application No. 61/541,423 filed Sep. 30, 2011, which are incorporated herein by reference in their entirety.

FIELD

This application generally relates to transport systems and methods, and more specifically to systems and methods for providing vacuum to moving elements in a transport system such that the vacuum is available at the moving element even while moving.

BACKGROUND

One issue for transport systems, including various types of conveyor systems, is the provision of power to a moving element/pallet for use as a power source on the moving element/pallet, either while stationary or moving. Having a power source on the moving element/pallet can be used for many different reasons during processing, testing or the like.

Conveyor or transport systems are used in many environments to move items or parts in an efficient manner. Transport systems will typically include moving elements that move in a controlled manner. Transport systems may also include pallets designed for carrying or supporting the items or parts that are to be moved. The pallets may be separate or combined/connected with the moving elements.

In some circumstances, the pallets are required to carry or support breakable, flexible or small parts. Conventional or pallets may have some fixturing or other means of supporting the parts or the parts may be held down by gravity but conventional pallet support systems often have difficulty in handling these types of parts and result in having the part fall or break during transportation due to changing acceleration, bumping, or other factors. Conventional fixtures are larger than the parts the fixture is containing to accommodate the full tolerance range of both the parts being contained and the tooling tolerance stack-ups. The larger size allows parts to be loaded into the fixture or unloaded from the fixture reliably without jamming or damaging the parts, but the parts may not be held in a consistent precise location.

In other circumstances, the pallets may be required to provide or maintain various environments, for example, a vacuum, on the pallet for processing operations, clean-room type concerns or the like.

Conventionally, power is provided to the moving elements by having a battery on the moving element, connecting the moving element to a power source when stationary at a work station, or complex cabling systems to allow an electrical connection to the moving element.

Accordingly, it is, therefore, desirable to provide an improved system and method for providing vacuum on a moving element/pallet of a transportation system.

SUMMARY

Generally speaking, the embodiments described herein are intended to overcome at least one of the issues with conventional systems and methods.

According to an aspect herein, there is provided a system for providing vacuum to a moving element of a transport system. The system includes: a vacuum chamber on the moving element for storing vacuum; a vacuum source; a vacuum inlet provided on the vacuum chamber and for connection to the vacuum source; and a vacuum outlet in communication with the vacuum chamber and positioned on the moving element.

Having vacuum available at the moving element, and particularly while the moving element is moving, is intended to provide additional functionality at the moving element/pallet. This systems and methods herein may be particularly useful for automated assembly line conveyors and the like where bulky vacuum systems and power sources such as batteries may be too large or heavy to be provided to the moving element.

In a particular case, the vacuum source may also be provided on the moving element. In this case, the vacuum source may be driven by electrical energy. For example, the electrical energy may be provided by electromagnetic induction generated between the moving element and the transport system. Alternatively or in addition, the vacuum source may be driven by mechanical energy. For example, the mechanical energy may be generated by a friction wheel on the moving element engaging with a stationary element of the transport system. It will be understood that various combinations of electrical and mechanical energy may be available.

In another particular case, the vacuum outlet may be a vacuum gripper for supporting parts on the moving element.

In yet another particular case, the vacuum source may be provided on the transport system at a location where the moving element stops and is configured to engage with the vacuum inlet. In this way, the vacuum source can periodically re-charge the vacuum chamber for use during movement.

According to another aspect herein, there is provided a method for providing vacuum on a moving element of a transport system, the method including: providing a vacuum source; providing a vacuum chamber having a vacuum inlet between the vacuum chamber and the vacuum source and a vacuum outlet in communication with the vacuum chamber and positioned on the moving element; driving the vacuum source to charge the vacuum chamber; recharging the vacuum chamber as required.

In a particular case, the vacuum source may be provided on the moving element. In this case, the driving the vacuum source may include driving the vacuum source via electromagnetic induction or via mechanical energy. For example, driving the vacuum source with mechanical energy may include engaging a friction wheel on the moving element with the transport system to generate the mechanical energy.

According to another aspect herein, there is provided a system for providing vacuum at a moving element on a conveyor, the system including: a vacuum source on the moving element; a power source on the moving element for driving the vacuum source; and a vacuum outlet in communication with the vacuum source and positioned on the moving element.

In this aspect, the vacuum source provides vacuum directly rather than via a vacuum chamber for storing vacuum. However, it will be understood that a vacuum chamber may also be used.

In a particular case, the power source may include electrical energy generated by electrical induction between an induction receiver on the moving element and an induction transmitter on a stationary element of the conveyor. Alternatively or in addition, the power source may include mechanical energy generated by a friction wheel provided between the moving element and a stationary element of the conveyor.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures. The drawings included herewith are for illustrating various examples of systems and methods for providing power to moving elements in a transport system and are not intended to limit the scope of what is taught in any way. In the drawings:

FIGS. 12A to 12D show diagrammatic representations of a method of providing power to a moving element;

FIGS. 17A to 17D illustrate further detail of the pallet of the embodiment of FIG. 14;

FIGS. 18A to 18D illustrate a vacuum indicator of the embodiment of FIG. 14;

FIG. 23A to 23D illustrate a further embodiment of a moving element/pallet having a vacuum system;

DETAILED DESCRIPTION

Numerous specific details are set forth in order to provide a thorough understanding of the example embodiments described herein. However, it will be understood by those of ordinary skill in the art that the embodiments described herein may be practiced without all specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein. The embodiments described herein are not intended to be limited to the specific details of any one example embodiment or to specific details that may be common to multiple, or all, example embodiments. The applicants, inventors or owners reserve all rights that they may have in any embodiments disclosed herein, for example the right to embodiments claimed in a continuing application, and do not intend to abandon, disclaim or dedicate to the public any such embodiments by disclosure of this document.

Figure 1:
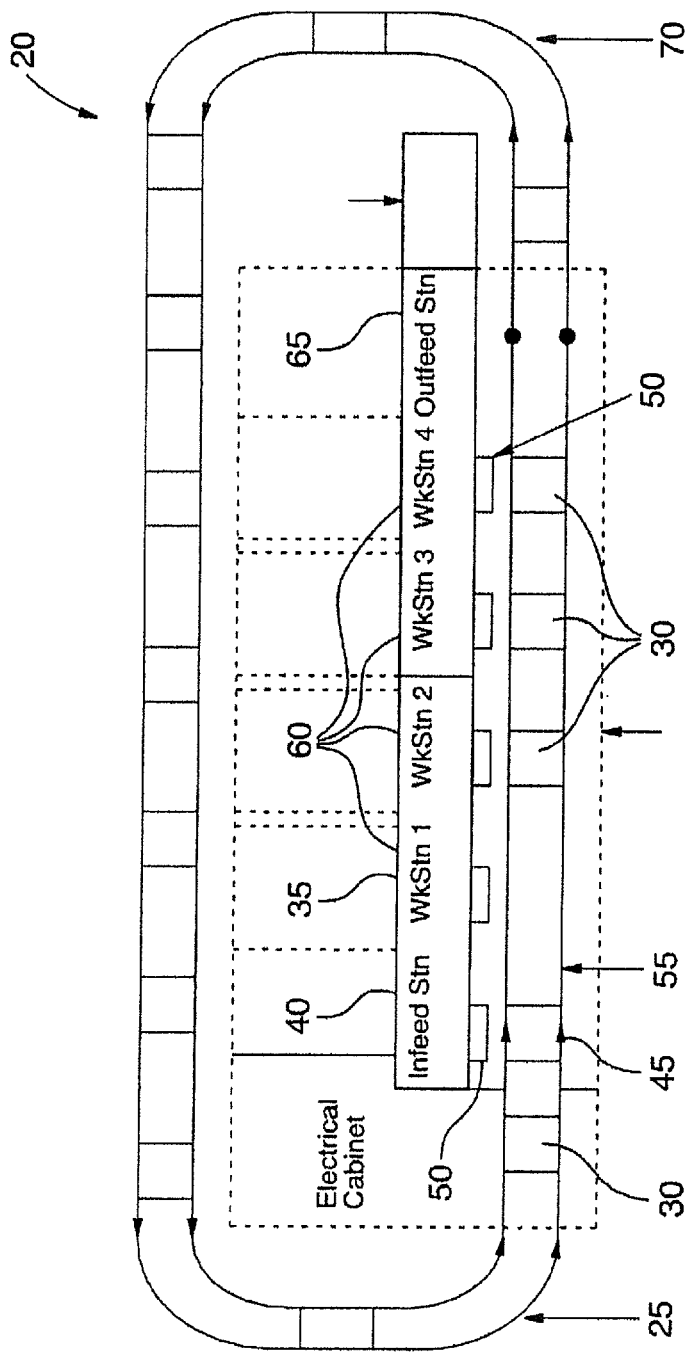
FIG. 1 is a schematic diagram of a transport system, in particular a modular conveyor system.

FIG. 1 shows a general schematic diagram of a modular conveyor system 20, which will be used to provide a general description of the system. It should be understood that other transport systems, such as systems using semi-autonomous vehicles or the like, may also be used with embodiments disclosed herein and the system and method for providing power to a moving element may function equally as well with other appropriate transport systems.

In some cases, such as shown in FIG. 1, the system 20 includes an infeed conveyor 25, which delivers pallets 30 to a track section 35. The infeed conveyor 25 may be, for example, a belt conveyor, conveyor known in the art, or the like. As the pallets 30 arrive at an infeed station 40, they are detected and held at the infeed station 40 by a holding mechanism 45, such as a gate, lock or the like. A moving element 50 mounted on the track section 35 engages with the pallet 30 at the infeed station 40 and, after release from the holding mechanism 45, the moving element 50 moves the pallet 30 onto a pallet rail 55 that is positioned adjacent the track section 35 and transports the pallet 30 in an independently controlled manner to a workstation 60. At the workstation 60, the pallet 30 is accurately positioned by the moving element 50 and then held in a place by a locking mechanism (not shown in FIG. 1) provided at the workstation 60. The workstation 60 typically includes an apparatus (not shown) such that an operation, for example a pick and place or other operation, can be performed on a workpiece (not shown), such as a part, device or the like that is being carried by the pallet 30. While the pallet 30 remains at the workstation 60, the moving element 50 can be disengaged from the pallet 30 and is free to move and collect a subsequent pallet 30 while another moving element 50 may return to connect with the pallet 30 at the workstation 60. In this way, the movement of each pallet 30 from workstation 60 to another workstation 60 is carried out by moving a plurality of moving elements 50 along the track section 35, each moving element 50 being independently controlled. Other transport systems may also benefit from the system and methods described herein.

Figure 2:
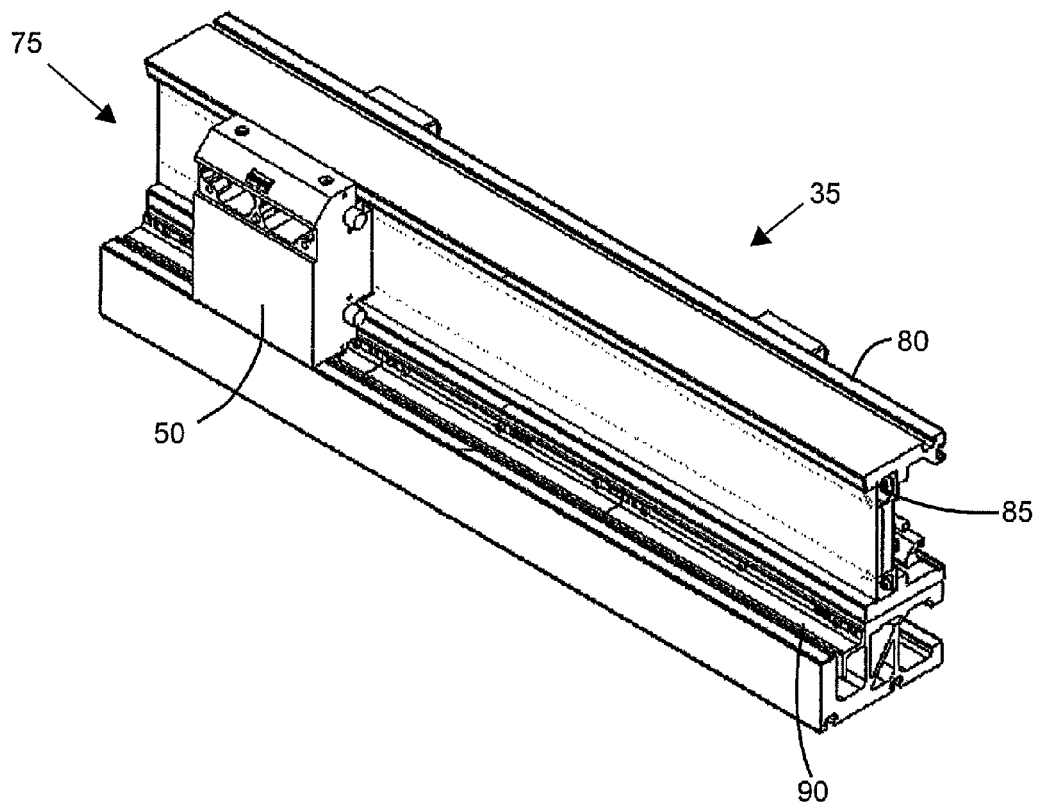
FIG. 2 is a perspective view of a track section of the modular conveyor system of FIG. 1.

FIG. 2 illustrates a track section 35 of the modular conveyor system 20. The track section 35 features one or more moving elements 50 (only one is illustrated) which are configured to ride or travel along a track 75 and stop at workstations positioned along the track 75. The track 75 includes a frame 80 configured to support the moving element 50 on an upper runner 85 and lower runner 90. Some of the principles of operation of the track section 35 are described in more detail in U.S. Pat. RE39,747 to Peltier, which is hereby incorporated herein by reference.

Figure 3:
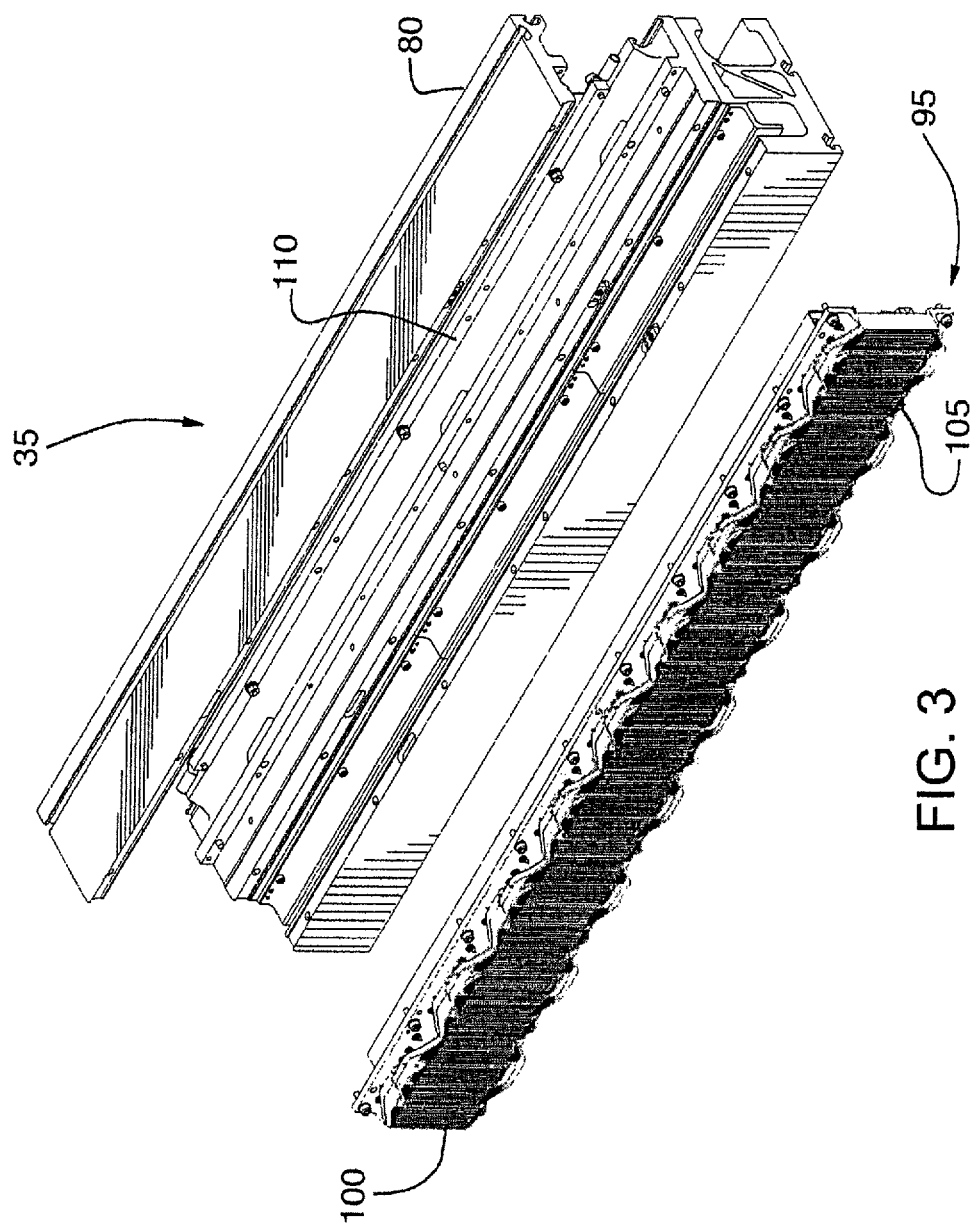
FIG. 3 is an expanded view of the track section of FIG. 2.

FIG. 3 illustrates an expanded view of the track section 35. The frame 80 houses a linear drive mechanism 95 that is formed as a stator armature 100 having a plurality of embedded coils 105 which are individually excited so that an electrically-induced magnetic flux produced by the stator armature 100 is located adjacent to a given moving element 50 to be controlled, in a direction normal thereto, without significantly affecting adjacent moving elements 50. The coils 105 are arranged as a sequence of individual polyphase-like windings or coil sets, wherein coils in each set are overlapped such that the coil centres are spaced apart. The frame 80 also includes a bus bar 110 to provide power to the stator armature 100. The motive force for translating each moving element 50 arises from the magnetomotive (MMF) force produced by each moving element 50 and the stator armature 100, i.e., by the tendency of the corresponding magnetic fluxes provided by the stator armature 100 and moving element 50 to align. A servocontrol system (described below) enables separate and independent moving MMFs to be produced along the length of the track section 35 for each moving element 50 so that each moving element 50 can be individually controlled with a trajectory profile that is generally independent of any other moving element 50. Structurally, the track section 35 may thus be broadly classified as a moving-magnet type linear brushless motor having multiple moving elements 50.

Figure 4A:
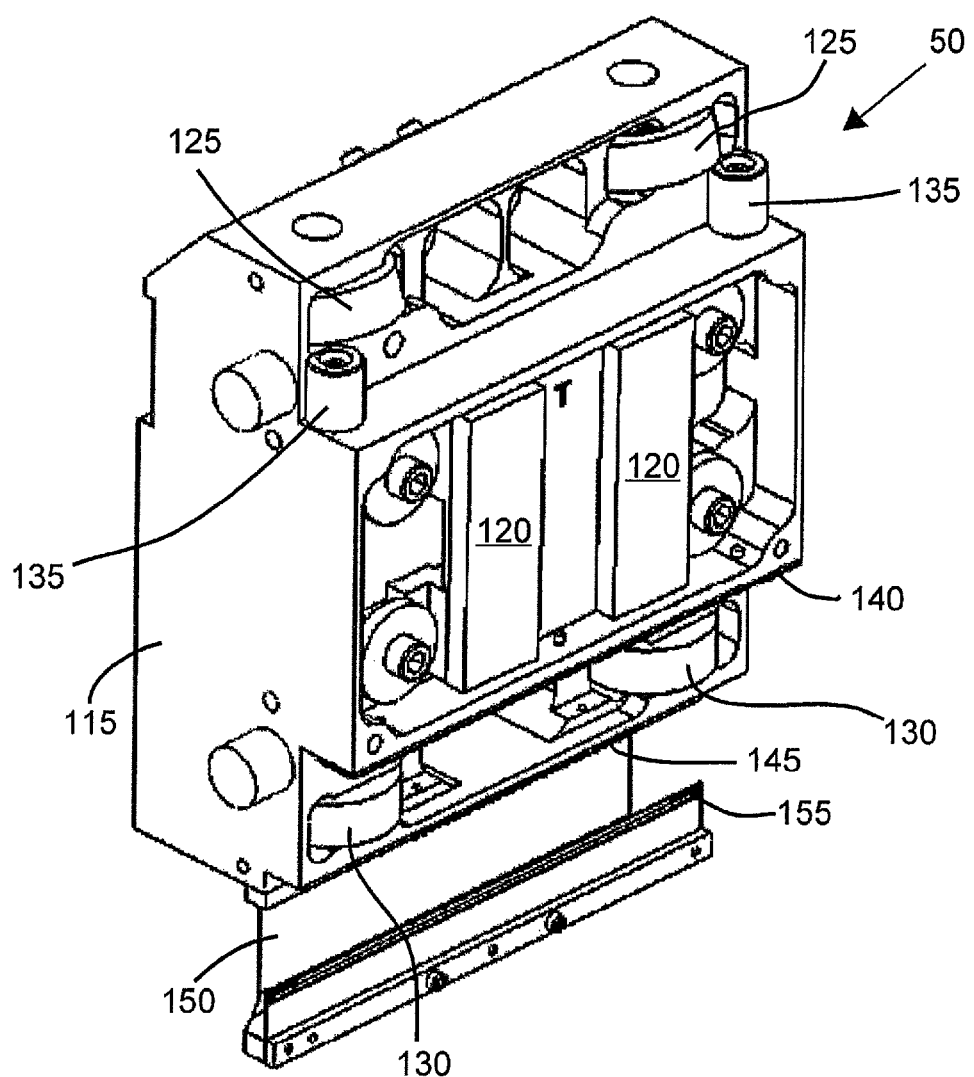
FIGS. 4A and 4B are perspective views of a moving element of the track section of FIG. 2.
Figure 4B:
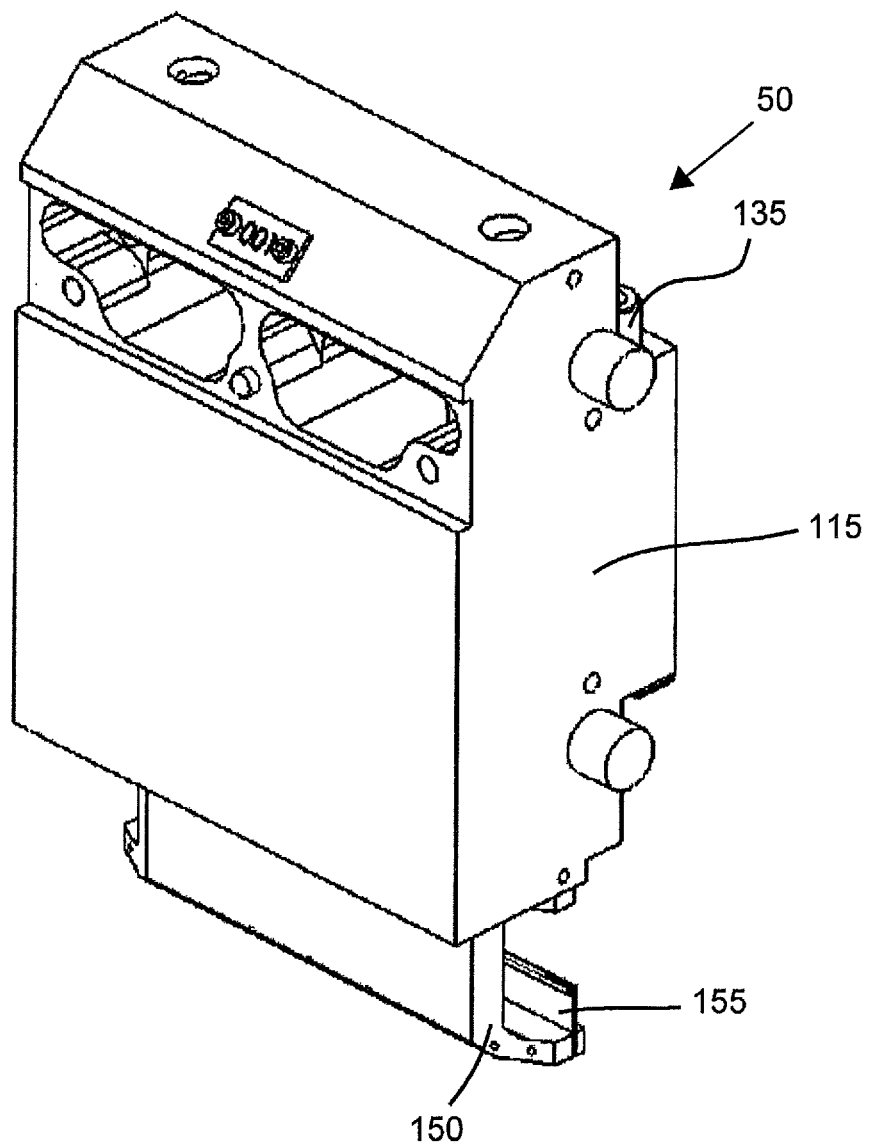
Figure 5:
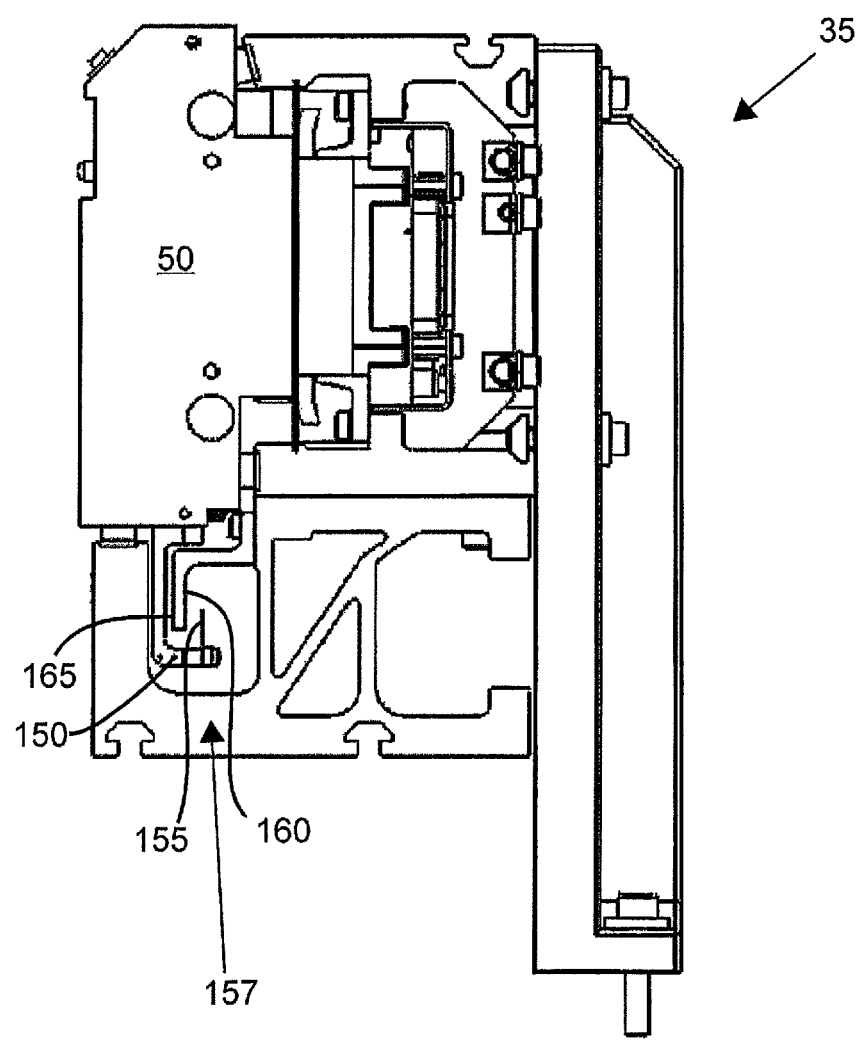
FIG. 5 is a sectional view of the track section, moving element and part pallet.

FIGS. 4A and 4B illustrate perspective views of the moving element 50 and FIG. 5 shows a sectional view of the track section 35, moving element 50 and pallet 30. As shown in FIG. 4A, each moving element 50 includes a body 115 which houses one or more permanent magnets 120 disposed to provide a magnetic flux orientated normal to the track section 35. In the example configuration of FIG. 4A, the magnetic structure of each moving element 50 comprises two thrust-producing permanent magnets 120 arranged in alternating North-South sequence.

As shown in FIGS. 4A, 4B and 5, each moving element 50 features upper wheels 125 and lower wheels 130 which ride along upper and lower runners 85, 90 of track 75. Each moving element 50 includes an extension 150 onto which is mounted an encoder strip 155, which may be, for example, an optically transmissive or reflective strip, a magnetic strip, other type of feedback system or the like. The extension 150 is configured such that the encoder strip 155 interacts with encoder read heads 160 mounted to a corresponding extension 165 extending from the track 75 (see FIG. 5). The encoder read heads 160 are configured to read the encoder strip 155, whether optically, magnetically or otherwise. The encoder strip 155 and encoder read heads 160 form an encoder system 157.

Figure 6A:
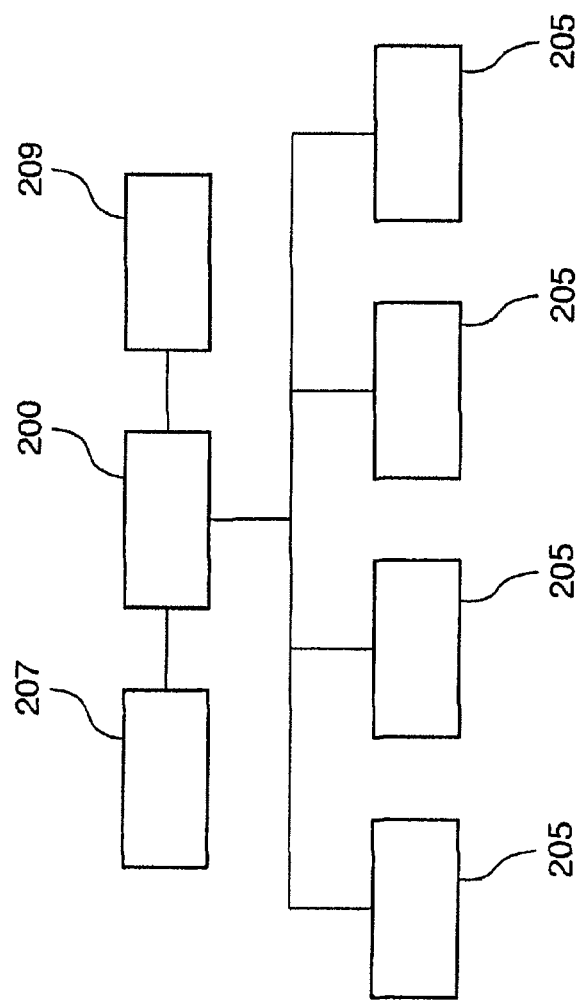
FIGS. 6A and 6B are block diagrams of an example distributed control architecture for controlling the track section of FIG. 2.

FIG. 6A is a block diagram of an example control architecture employed in the conveyor system 20. As shown in FIG. 6A, the conveyor system 20 includes a central controller 200 that controls the overall conveyor system 20 and a section controller 205 for each of the track sections 35 used in the conveyor system 20 (four section controllers 205 are shown). The central controller 200 may monitor destination data for the moving elements 50 (which are preferably uniquely addressed) and receive acknowledgement messages in return when moving elements 50 have reached their destinations. As such, the central controller 200 may be used for process (i.e. manufacturing-line) control. The central controller 200 may also provide a supervisory diagnostic role by monitoring the section controllers 205 (e.g., by engaging in a continuous polling process) in order to determine whether any section controller 205 has failed. It will also be understood that the central controller 200 may also provide control for the infeed conveyor 25 and outfeed conveyor 70, for example via infeed controller 207 and outfeed controller 209.

Figure 6B:
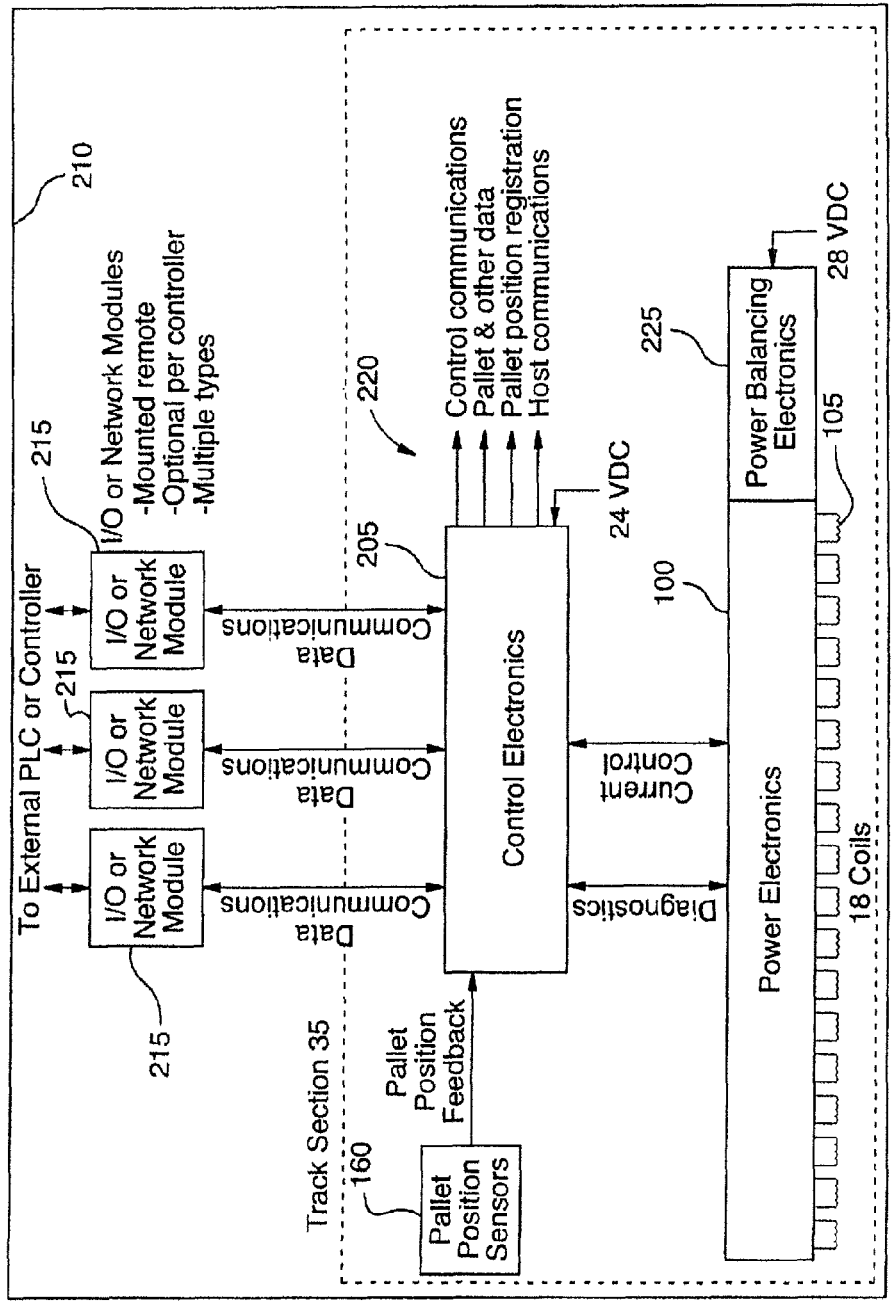

FIG. 6B is a block diagram of an example control system 210 for a track section 35. The control system 210 includes the section controller 205 that is connected to the central controller 200 via, for example, an input/output (I/O) or network module 215. In this embodiment, the section controllers 205 are connected to one another in a peer-to-peer communications network such that each section controller 205 is connected to preceding and following section controllers 205 through communications link 220. It will be understood that other alternative embodiments may include use of the central controller 200 to convey information/data between section controllers 205 or the like.

As illustrated, each section controller 205 is connected to the stator armature 100 and coils 105 in the corresponding track section 35 and controls the coils 105 independently, in order to control an adjacent moving element 50, for example, with an independent trajectory or "move" command.

Each track section 35 also includes power balancing electronics 225 that may include, for example, current amplifiers, current sensing circuitry, temperature sensor, voltage sensors and the like. The section controller 205 may periodically poll the power balancing electronics 225 in order to obtain diagnostics data provided by these sensors.

Each section controller 205 is also connected to the encoder read heads 160 situated in the track section 35. The section controller 205 is used to implement a closed-loop digital servo control system that controls movement of the moving element 50 by resolving the absolute position of each moving element 50 located in its track section 35. The section controller 205 makes use of a moving element position feedback subsystem, which supplies measured moving element position data to the section controller 205. Referring to FIGS. 4A, 4B and 5, when the encoder strip 155 of a given moving element 50 moves over a given encoder read head 160, signals are produced and cause the section controller 205 to update the position of the moving element 50 in accordance with the direction of travel of the encoder strip 155. The section controller 205 provides processing for sampling the encoders 160 and resolving the position of each moving element 50 located in the associated track section 35. Broadly speaking, the processing associates the encoder strip 155 of any given moving element 50 with only one encoder 160 at any time so that the absolute position of the given moving element 50 can be calculated based on a fixed position of the associated encoder (or more specifically its read head 160) and a relative position of the encoder strip 155 in relation to the associated encoder 160. In addition, when the encoder strip 155 simultaneously engages two encoders 160, the processing transfers or hands-off the association or "ownership" of the moving element 50 from the current encoder 160 to an adjacent engaged encoder 160. In this manner, the position of a given moving element 50 can be continuously tracked across the control zone. When a moving element 50 crosses control zones, a similar process occurs, with the addition that the adjacent section controller 205 creates a data structure to keep track of the position of the given moving element 50, and, once the hand-off is completed, the data structure for the moving element 50 in the (now) previous control zone is deleted.

Those skilled in the art will appreciate that the encoder system 157 may be optical or may be another alternative system. For example, a passive readable device can be a magnetic strip and the encoder read heads can be corresponding magnetic detectors.

Figure 7:
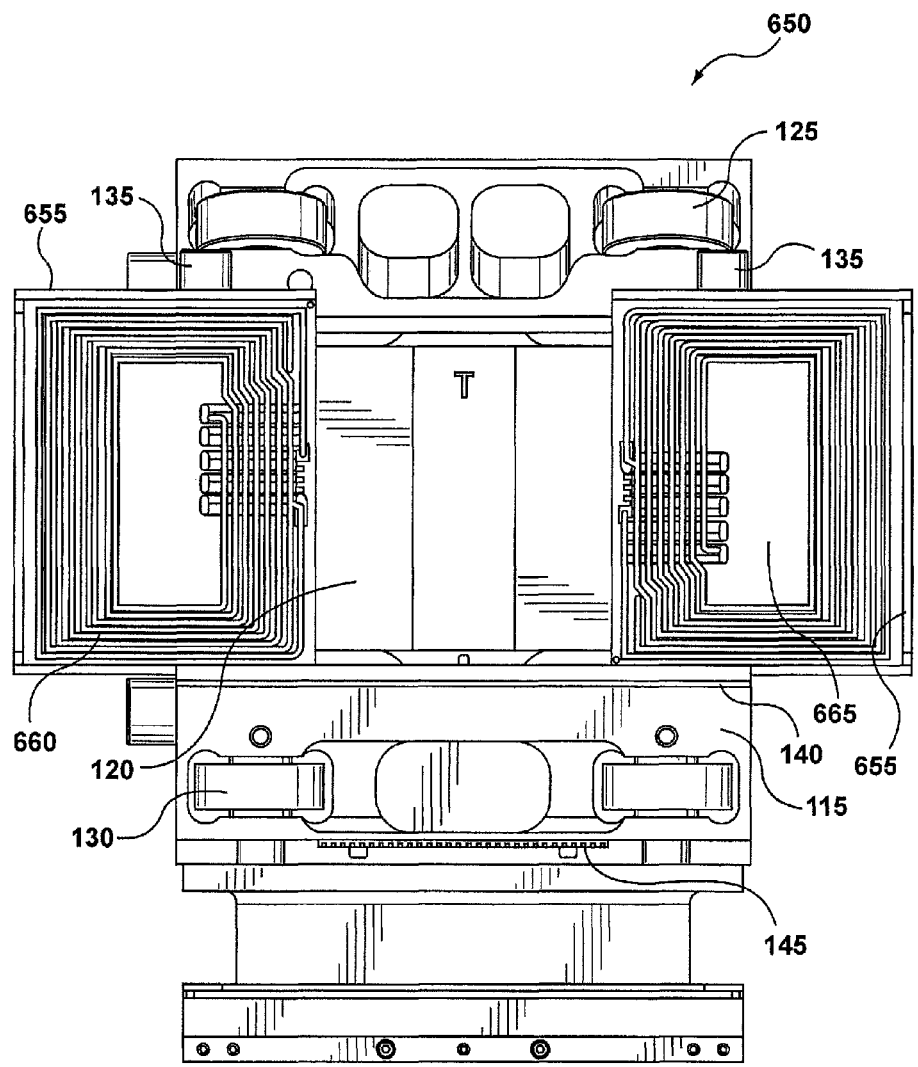
FIG. 7 illustrates a perspective view of a moving element according to another embodiment.

FIG. 7 illustrates another embodiment of a moving element 650. Similarly to the moving element 50 shown in FIGS. 4A, 4B and 5, each moving element 650 includes a body 115, which houses at least one permanent magnet 120. The at least one magnet 120 provides a magnetic flux orientated normal to the track section 35. Other elements of the moving element 650 are also similar to the moving element 50, unless otherwise indicated.

In this alternative embodiment, the moving element 650 is provided with at least one power pick-up panel 655. In some cases, the power pick-up panel 655 may be referred to as an energy pick-up element, an inductive pick-up element or an inductive panel. In the current embodiment, inductive transfer of power is used and two induction panels 655 are provided to and protrude from the body 115 of the moving element 650. As shown in FIG. 7, the two induction panels 655 are incorporated on either side of the moving element 650, and adjacent to the at least one magnet 120 in the longitudinal direction of the track section 35. In this case, the induction panels 655 are approximately equidistant from a center line of the moving element 650. This arrangement can allow for a balancing of the provision of inductive power as explained in further detail below. It will be understood that a plurality of induction panels 655 may also be used.

The induction panels 655 include at least one induction pick-up coil 660. The induction panels 655 also include one or more ferrite cores 665. The field of induction coils is well known and an appropriate coil and/or ferrite core arrangement can be chosen depending on the required power transfer.

As noted above, the linear motor 95 used in the present embodiment allows for individual control over each linear motor coil 105 in a track section of the transport system (for example, 18 coils per 900 mm section), see, for example, FIG. 3. This individual control allows each moving element 650 to be directly controlled by the linear motor coils 105 that are in the vicinity of the moving element 650. Linear motor coils 105, which do not have a moving element 650 in their vicinity, are generally controlled to produce no substantial magnetic field.

In the present embodiment, the linear motor coils 105 are normally driven using pulse width modulation (PWM) at a higher frequency, for example 20 kHz, in order to provide an electromagnetic field to drive the moving elements 650. The higher frequency of modulation is used such that, when combined with the coil inductance, the linear motor coil 105 produces a generally smooth magnetic field with relatively little AC ripple. This is advantageous to reduce eddy current losses and because excessive magnetic ripple could cause vibrations of the moving elements and make accurate positional control difficult.

In order to be able to provide inductive power transfer, however, an alternating electromagnetic field is used to couple a source coil, (in this case, the motor coils 105) and a pick-up coil (in this case, pick-up coils 660). As described below, placing pick-up coils 660 just before and after the magnets 120 of the moving element 650 and reducing the frequency of PWM for motor coils 105 in the vicinity of the pick-up coils 660, inductive power transfer can be implemented without significant additional materials and without significant impact on the position control system.

Since the use of the linear motor coils 105 to drive the moving elements 650 is designed to minimize ripple by providing a smooth magnetic field and stable positioning (for example, using 20 kHz modulation), the AC ripple component of the linear motor coils 105 would generally be insufficient to couple any useful amount of power to the pick-up coils 660. However, by reducing the modulation frequency (for example, to approximately 1 kHz) of only the linear motor coils 105 under the pick-up coils 660, the AC ripple component (i.e. varying electromagnetic component) of the field can be increased to allow appropriate levels of power to be transferred to the pick-up coils 660 of the moving element 650. Power can be provided to the moving element 650 when it is stationary, or may be used to aid the movement of the moving element.

Figure 8:
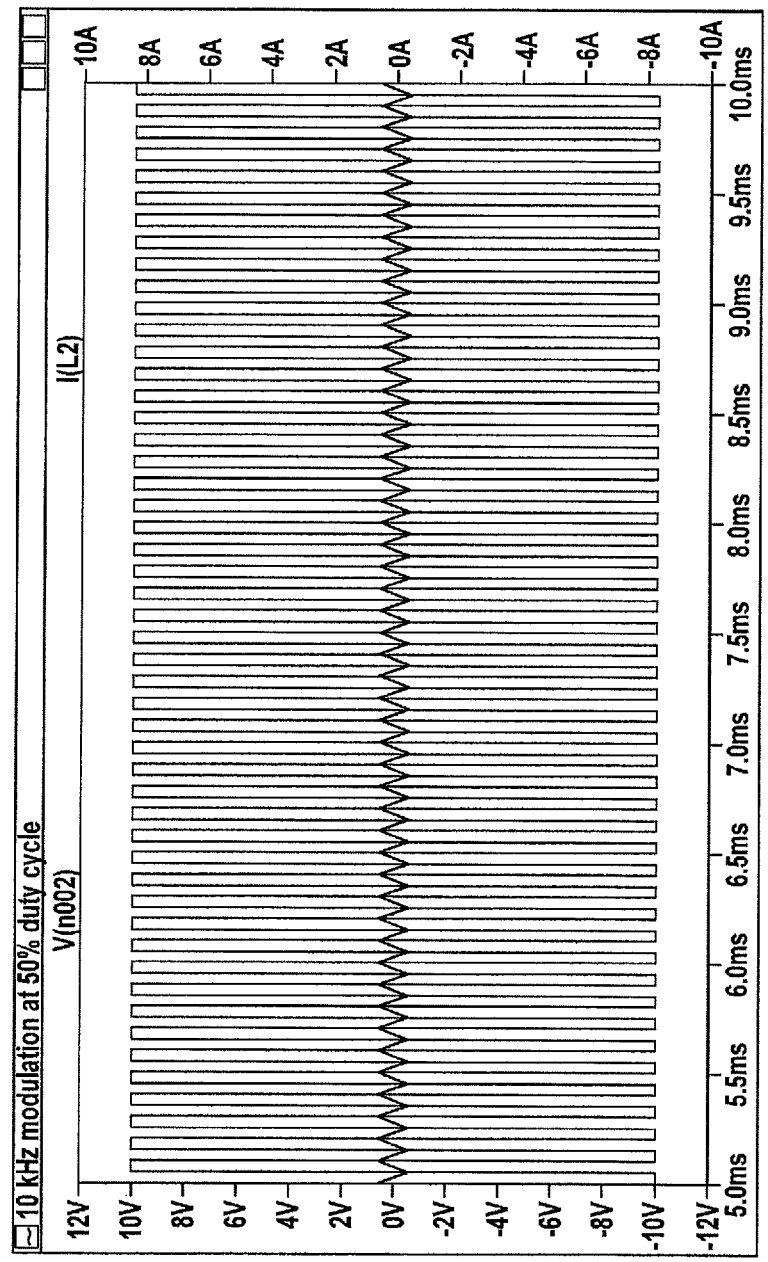
FIG. 8 shows a graph illustrating the average current at a 50% duty cycle and 10 kHz modulation frequency.

FIGS. 8 to 11 illustrate graphical representations of the effect of modulation frequency and pulse width modulation duty cycle. FIG. 8 illustrates a motor coil regulated at 50% duty cycle and 10 kHz modulation frequency. It can be seen that the average current is zero and that there would be a small ripple current. A motor coil (105) operating in this way would typically not have an impact on a moving element 650 because the average current is zero (i.e. no net magnetic field, which would mean no force and therefore no movement) and minimal ripple current (i.e. no power induction).

Figure 9:
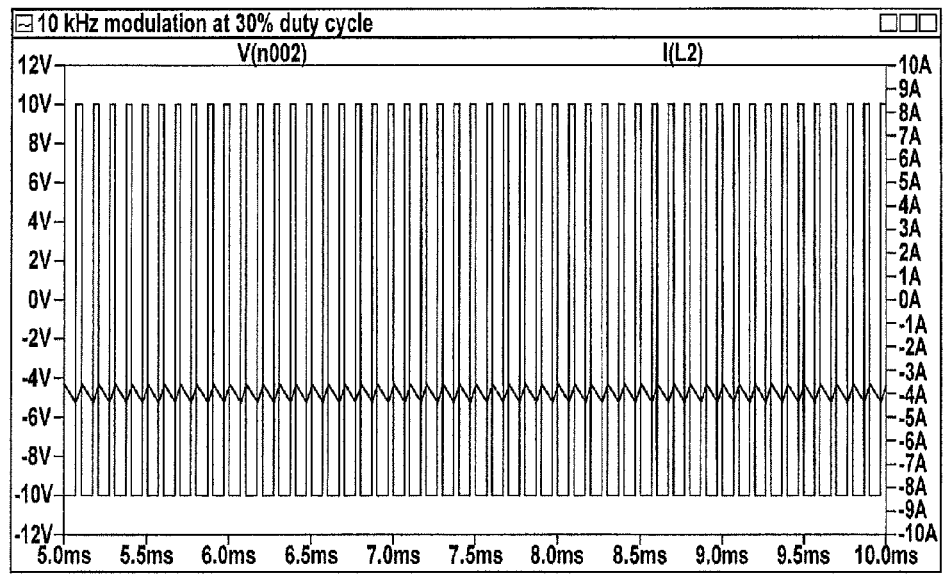
FIG. 9 shows a graph illustrating the average current at a 30% duty cycle and 10 kHz modulation frequency.

FIG. 9 illustrates a coil at 30% duty cycle and 10 kHz modulation frequency. In this case the average current can be seen at negative 4 amps. In this case, there will be a net magnetic field and the moving element 650 will move accordingly. Note that a full range of duty cycle may be used, 99% for maximum forward force and 1% for maximum reversing force. As in FIG. 8, there is a small ripple current of a similar magnitude. The net resulting magnetic field may still have a ripple component but will have a predominant offset value, which will apply an accelerating force to the moving elements in the vicinity. Similar to the situation in FIG. 8, a pick-up coil placed in the low ripple magnetic field generated as shown in FIG. 9 would have negligible voltage induced in it.

Figure 10:
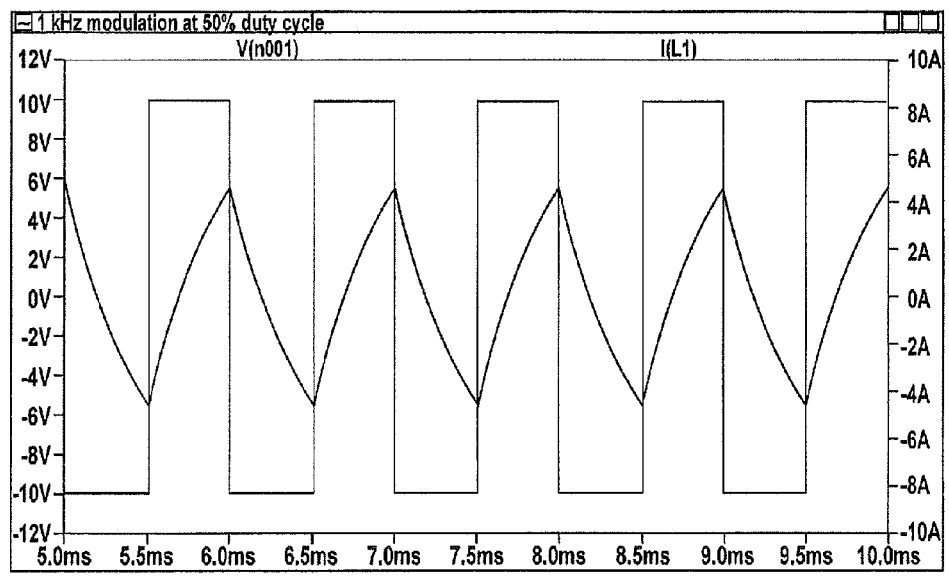
FIG. 10 shows a graph illustrating the average current at a 50% duty cycle and 1 kHz modulation frequency.
Figure 11:
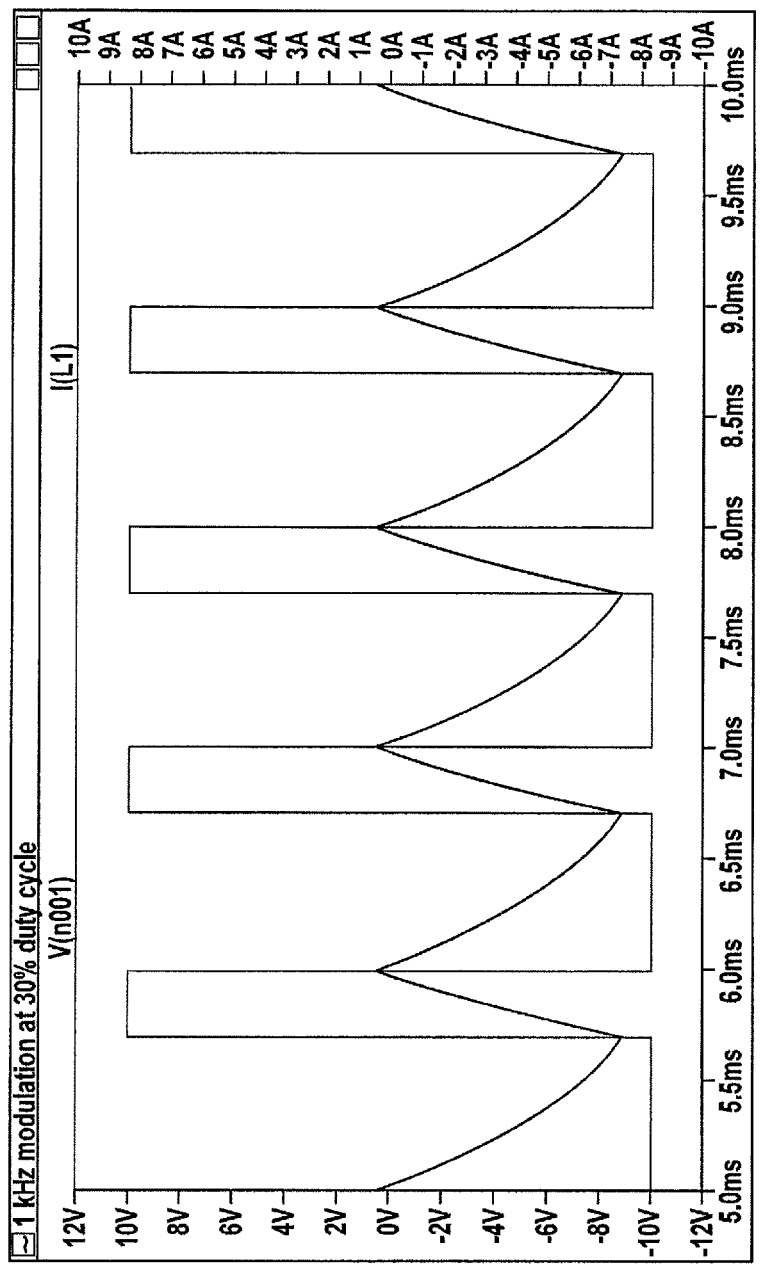
FIG. 11 shows a graph illustrating the average current at a 30% duty cycle and 1 kHz modulation frequency.

FIG. 10 and FIG. 11 show a coil at a 50% and 30% duty cycle respectively, both at a 1 kHz modulation frequency. At this modulation frequency a larger ripple current is created. At a 50% duty cycle, the net resulting magnetic field has a significant alternating (ripple) component, but the average field remains zero. A pick-up coil in this magnetic field would have an alternating voltage induced in it but the average magnetic field (accelerating force) would remain at approximately zero. At a 30% duty cycle, the net resulting magnetic field has a predominant offset value as well as a significant alternating (ripple) component. The offset value has an accelerating force on the moving elements 650 in the vicinity. As above, a pick-up coil placed in this magnetic field would have an alternating voltage induced in it. Thus, the use of a lower modulation frequency can provide power to pick-up coils, while limiting the impact on the positional stability or movement of the moving element.

The selection of the higher and lower frequencies depends on variables, including, for example, motor inductance, air gap, pickup inductance, and coil drive electronics. For some cases, a PWM frequency range may be between 10 and 30 kHz when only moving the moving elements 650. In other cases, the nominal PWM frequency range may be between 20 and 22 kHz, while for a specific case, 21.5 kHz may be appropriate. These frequency ranges may be used when not providing power due to somewhat smoother control of movement at higher frequencies but are not required. With regard to power transfer (which may also involve movement), an example range of 0.5 to 10 kHz may be useful. In other cases, the range used may be between 4 and 6 kHz, while for a specific case, 5.375 kHz may be appropriate.

As a moving element 650 moves along the track section 35, the control electronics (control system) 205 control the operation of the linear motor coils 105 to both move and position the moving element 650 and provide power to the moving element 650. In particular, the control electronics 205 control which linear motor coils 105 should be modulated at reduced frequency so that power is continually transferred to the moving element 650. As there is individual control over the linear motor coils 105, the linear motor coils 105 that have no moving element 650 (or, more precisely pick-up coil 660) over or near them will produce little AC or DC electromagnetic field and, in appropriate cases, may be turned off resulting in power savings. It will be understood that the linear motor coils 105 may also be used only to provide power to a stationary moving element 650 or to a moving element 650 that is being advanced using another technology such as that shown in FIG. 8.

FIGS. 12A to 12D are diagrammatic representations of an example of the movement and provision of power to a moving element. In these figures, motion is from left to right. The linear motor coils 105 or portions of these coils, which are under the magnet poles 700 at any point in time, may be modulated to produce the force required to maintain the moving element 650 at its desired position.

Figure 12C:
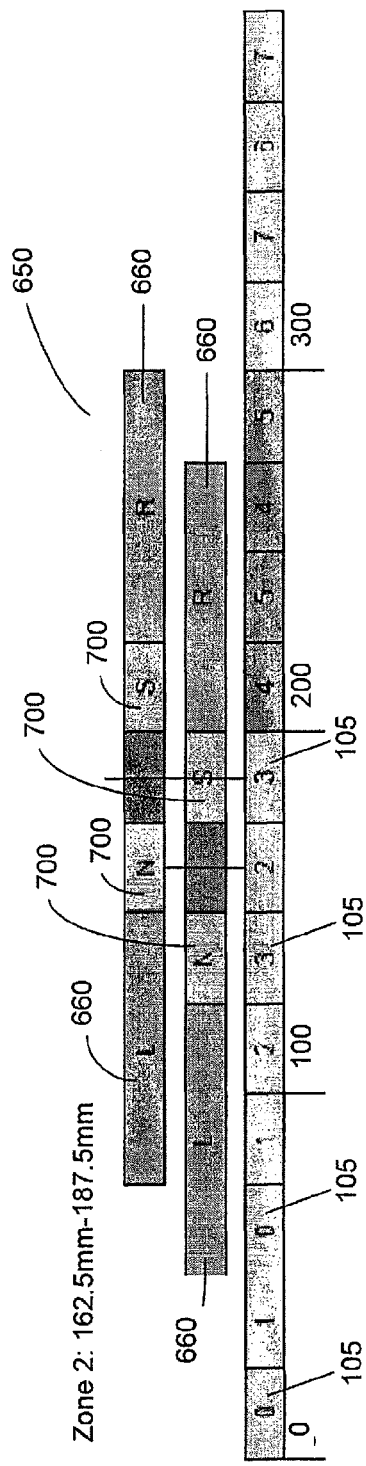
Figure 12D:
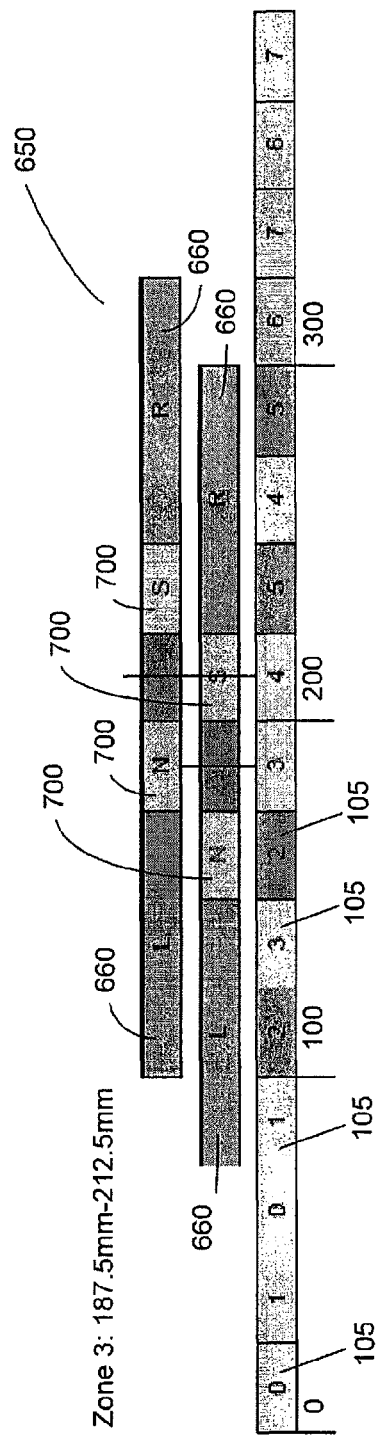
Figure 13:
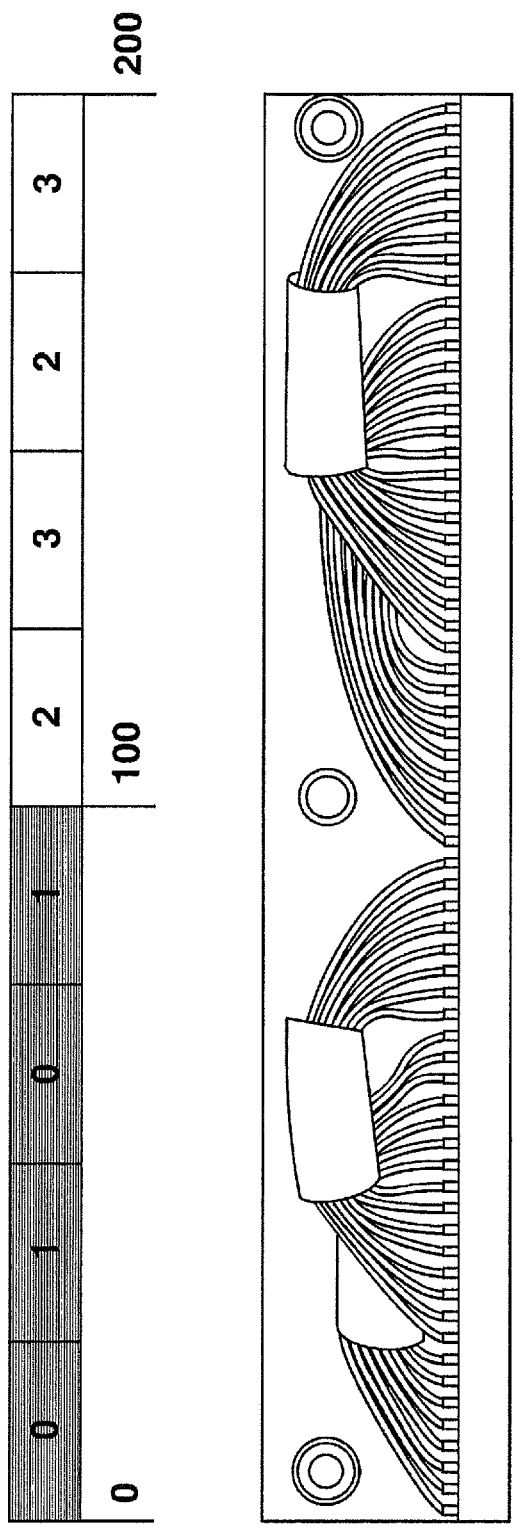
FIG. 13 illustrates coils of a linear motor in relation to the diagrammatic representation of FIG. 12.

In FIG. 12A, the upper two bars represent the moving element at two different times; in this Figure the moving element 650 is shown in transition from 112.5 mm to 137.5 mm. The upper bar shows the moving element 650 after the moving element 650 is advanced 25 mm in relation to the lower bar. The left and right pickup coils 660 are labelled L and R, the magnet poles 700 are labeled N, for north and S for south, and the dark gray portion in the middle of the moving elements is a physical gap. The third (lowest) bar in FIG. 12A represents the motor coils 105 of the linear motor. FIG. 13 shows a detail view of the motor coils 105 in relation to the diagrammatic representation. On the third bar, the motor coils 105 labeled 0, 1, 2, 3, 4, 5, and 6 are modulated at the optimal frequency to provide motive force and/or power transfer. When coils are positioned in front of the pickup coils L and R, they are modulated at a lower frequency to enable power generation. When coils are not located in front of the pickup coils L and R, they are modulated at high frequency for optimal motive force. Each of FIGS. 12B, 12C and 12D use a similar arrangement.

In FIG. 12A, for the lower bar at position 112.5 mm, coils 0, 1, 2, 3, and 4 are modulated at a lower frequency to enable both power transfer and pallet movement. For the upper bar at position 137.5 mm, coils 0, 1, 3, 4, and 5 are modulated at a lower frequency to enable both power transfer and pallet movement. In FIG. 12B, for the upper bar at position 162.5 mm, coils 0, 1, 2, 4, and 5 are modulated at a lower frequency to enable both power transfer and pallet movement. All of the remaining coils in the above example are modulated at high frequency. FIGS. 12C and 12D are similar and illustrate the way that power can be continuously provided to the moving element even while moving.

The power transfer to an individual moving element 650 can be turned on or off at any location at any time. To turn off the power transfer, the system could, for example, switch the coils 105 that are adjacent the pickup coils 660 to high frequency modulation. Similarly, the system can restore power transfer to a moving element 650 by, for example, returning the coils 105 adjacent the pickup coils 660 back to low frequency modulation. Overall, it is clear that independent control of the coils 105 allows for independent control of the pick-up coils 660. It will also be understood by one of skill in the art that the pickup coils 660 can be operated, i.e. be receiving power, even if not positioned directly over the coils 105.

The combination of two outboard pickup coils and the above frequency modulation scheme are intended to allow for a near constant voltage to be available on the moving element, irrespective of the position or movement of the moving element 650 and without the need for any on-pallet energy storage. By providing an appropriate configuration and adjusting the frequency, the system is intended to provide consistent power transfer and consistent motive force and minimize jitter.

In another embodiment, the transport system may be one in which all the moving elements on a specific track section are driven at the same time (i.e. do not have independent control). In this case, the power transfer may occur to the moving elements by changing the pulse width modulation frequency of the track section once the moving elements have reached their desired position. This would allow power transfer to the moving elements 650 from the motor coils 105 when the moving elements 650 are held in position.

Having power available on a pallet may be used in a variety of possible applications. For example, the power may be used to run a pump to generate vacuum and/or air pressure that is stored in a sealed chamber for use in processing; illuminate LED or other types of lighting; and/or power rotary motors, linear motors, ceramic motors, coils, and other electrical devices.

The following description relates to systems and methods for providing vacuum to a moving element/pallet. Some embodiments make use of the concepts of power at the moving element described above. A vacuum provided on, at or with a moving element or pallet is intended to allow for access to vacuum both when the pallet is stationary and when moving. In particular, vacuum can be used for holding or gripping parts The use of vacuum pressure is intended to improve repeatability in positioning of parts, reduce the danger of damage when moving a part several times or at higher speeds, and also improve the flexibility of a pallet to hold various kinds of parts or multiple parts without changes in fixtures or the like. Vacuum gripping may also allow for more effective processing of flexible parts. While embodiments herein generally relate to gripping, the provision of vacuum at the moving element/pallet could be used for other purposes that are currently known or become known in which a vacuum is useful at the pallet in related or appropriate processes.

Figure 14:
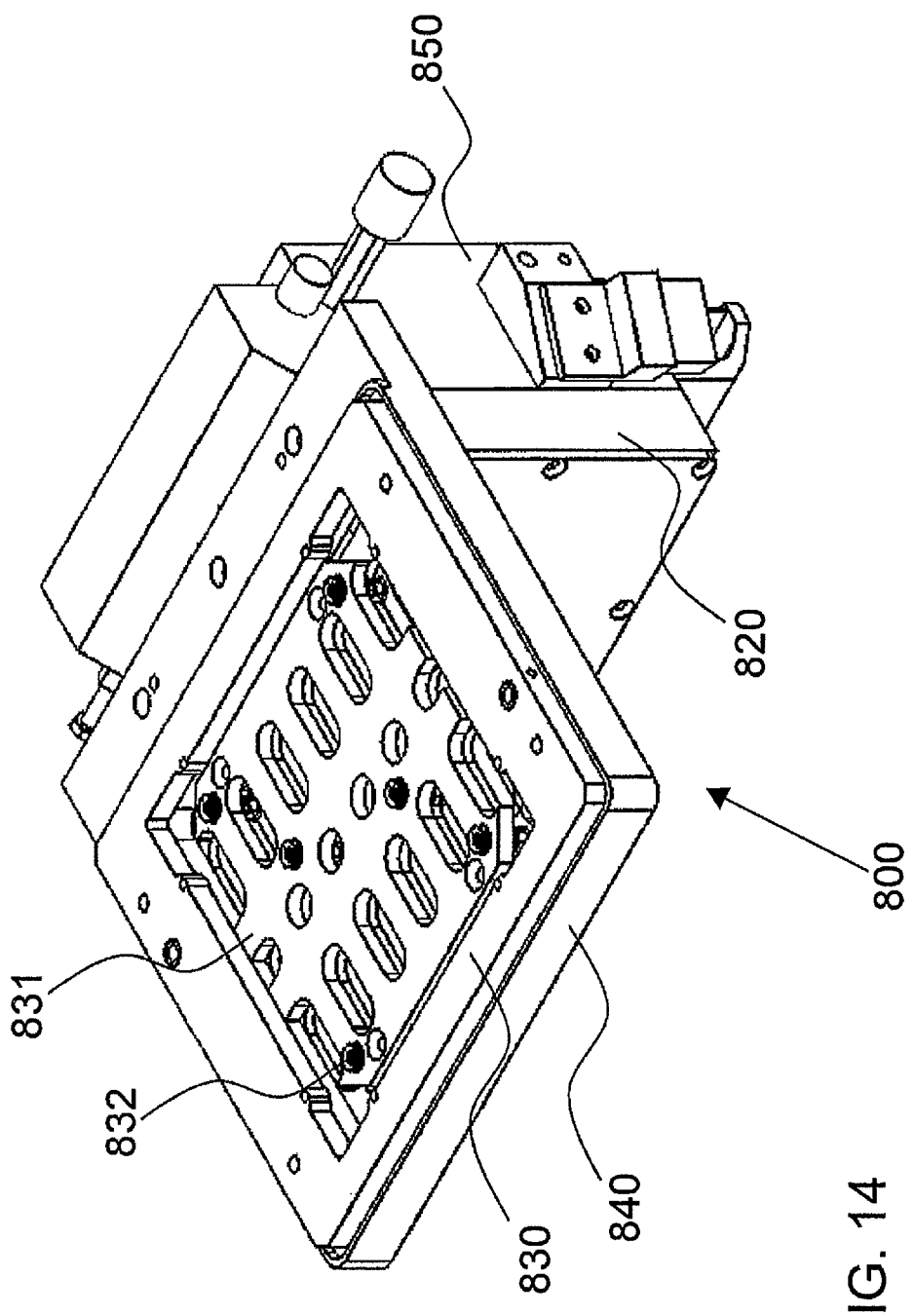
FIG. 14 is a perspective view of an embodiment of a moving element/pallet having a vacuum system.
Figure 15:
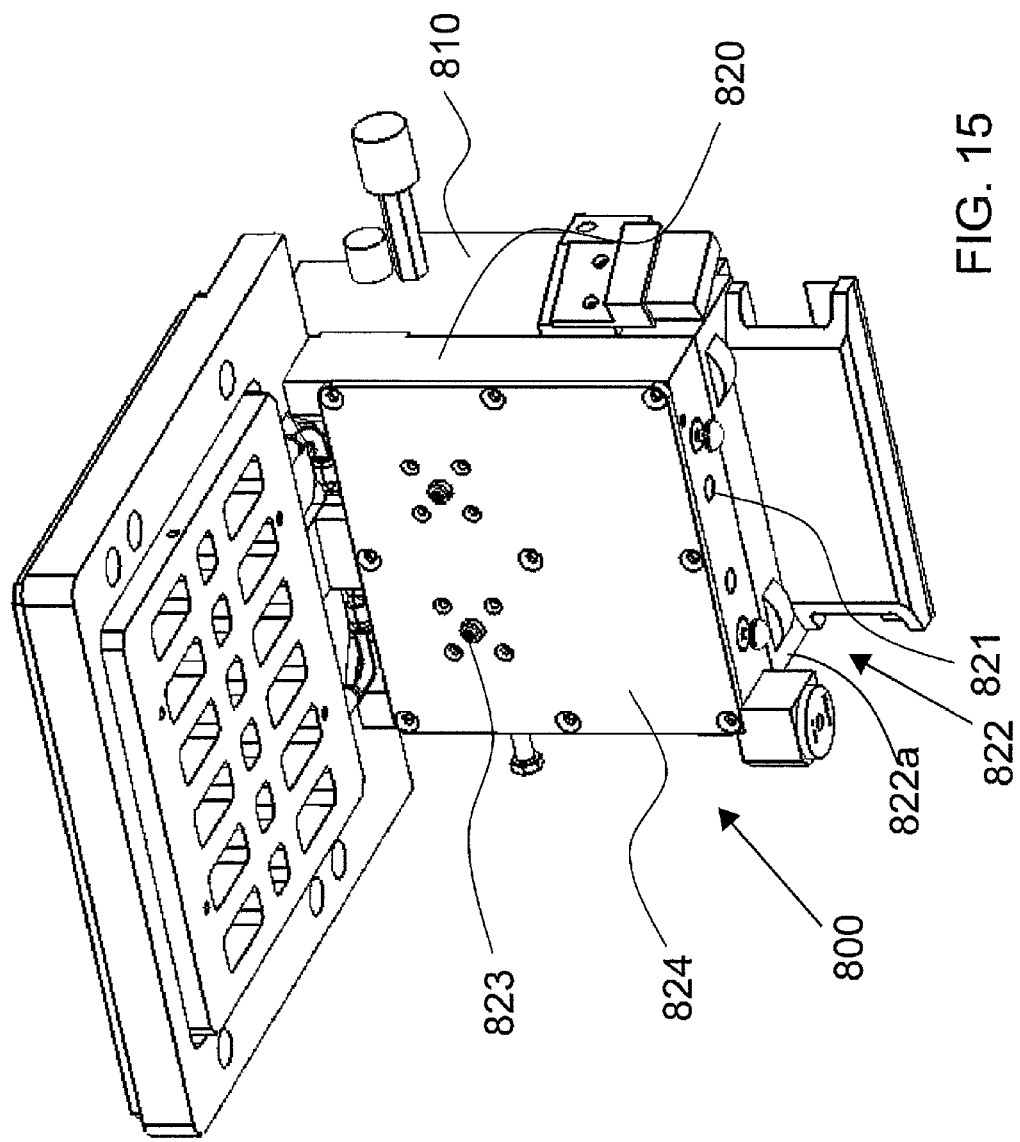
FIG. 15 is a bottom perspective view of the embodiment of FIG. 14.

FIG. 14 is a top perspective view of an embodiment of a moving element 850 having vacuum available. FIG. 15 is a bottom perspective view of the moving element 850. In this embodiment, the moving element 850 is generally similar to the moving elements described above. However, also as described above, it will be understood that alternate embodiments of the system and methods for providing vacuum at a moving element may be implemented on other transport and conveyor systems.

It will be understood that the moving element 850 may detachably engage with a pallet 830 or alternatively the moving element 850 may be affixed with the pallet 830. As such, the term "moving element" can also be understood to mean a moving element coupled permanently with a pallet, in which case the terms "moving element" and "pallet" are generally interchangeable. In this embodiment, the pallet 830 comprises a pallet body 831 and a pallet frame 840. The pallet 830 may have other features as described above.

As shown in FIG. 15, the pallet 830 and the moving element 850 includes a vacuum system 800. In some cases, the pallet 830 may include the vacuum system 800 without involvement from the moving element 850. In other cases, the moving element 850 may alone comprise the vacuum system 800 without involvement from the pallet 830.

The vacuum system 800 includes a vacuum component or a vacuum assembly 820 and at least one vacuum outlet associated with the pallet, in this case, vacuum gripper 832. The vacuum assembly 820 is in communication with (for example, pneumatically connected with) and provides a vacuum pressure to the vacuum gripper 832. Vacuum pressure is a negative pressure provided to the gripper 832 relative to atmospheric pressure.

The vacuum gripper 832 grips a part (not shown) located on the pallet 830. The vacuum gripper 832 may be chosen for the particular part being gripped and the particular application desired, as is known in the art. In another case, the vacuum gripper 832 may be replaced by other types of vacuum devices and functions, such as vacuum outlets.

The vacuum pressure provided to the vacuum gripper 832 is intended to hold the part in a fixed location relative to the pallet 830. The vacuum pressure may also be configured to maintain the position of the part relative to the pallet 830 while the moving element 850 and pallet 830 are moving/accelerating along the track 35 or while the part is being processed in a workstation.

In particular, the part will generally be loaded on the pallet 830 using a loader (not shown) such that the position of the part is accurately known. Alternatively, the position of the part may be measured after loading so that the part location is know and, when the part is being processed, the tool processing the part compensates for the actual position in any direction of the part. By using the vacuum system 800, it is intended that the part will be located more precisely and consistently than in a conventional fixture. This is intended to provide for a higher level of precision during processing of the part.

The vacuum system 800 is also intended to be adaptable to accommodate parts having a various sizes and/or various orientations. In conventional mechanical fixtures, swapping of tooling is often required to accommodate a different part variation. The vacuum system 800 is intended to provide increased flexibility because the vacuum system 800 and pallet 830 can be configured to accommodate a plurality of part variations.

As shown in FIGS. 14 and 15, the vacuum assembly 820 includes a vacuum chamber cover 824. The vacuum assembly 820 has at least one connection valve 821 for connection to a vacuum source (not shown). The vacuum assembly 820 may also have at least one ventilation valve 822 for providing a release of vacuum pressure. The ventilation valve 822 includes an actuation knob 822a which provides a mechanism to open and close the ventilation valve 822. In this case, the vacuum assembly 820 also includes at least one vacuum indicator 823 for indicating whether vacuum pressure is present within the vacuum assembly 820.

In this embodiment, the vacuum grippers 832 can act as a vacuum fixture and may sometimes be provided in cooperation with one or more mechanical fixtures (such as a formed surface matched to the part). The vacuum grippers 832 are intended to provide decreased damaged parts when compared to conventional systems which may rely on forces such as gravity to hold the part.

The pallet 830 may alternatively or also include a position indicator (not shown) to provide positioning information of the part. With a position indicator, a camera system (not shown) views the position of a part on the pallet 830 and the part, the pallet 830, or the moving element 850 includes a tag, such as a Radio Frequency (RF) tag. When the moving element 850 is in a workstation, the positioning values associated with the tag can be used to extract the orientation for the processing tools.

Figure 16:
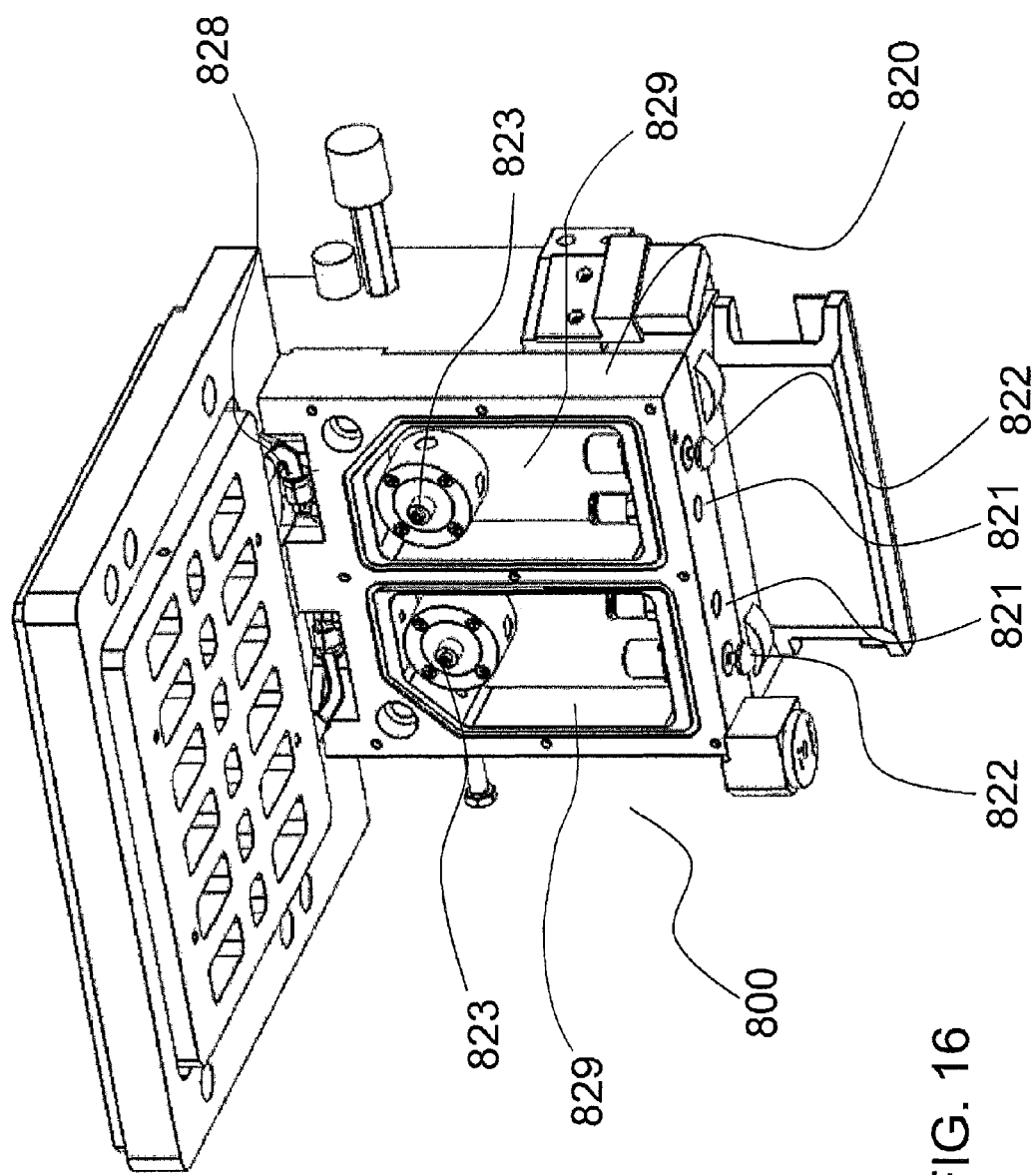
FIG. 16 is a bottom perspective view of the embodiment of FIG. 14 with a vacuum cover removed.

FIG. 16 is a bottom perspective view of the moving element 850, the pallet 830, and vacuum system 800 but having the vacuum chamber cover 824 removed. In this embodiment, the vacuum assembly 820 includes at least one vacuum chamber 829. The vacuum chamber 829 is an open space for holding the vacuum pressure and is connected to the pallet 830 via at least one conduit 828, such as a pneumatic hose.

As illustrated in FIG. 16, this embodiment of the vacuum assembly 820 includes two vacuum chambers 829. Each vacuum chamber 829 has a corresponding connection valve 821, ventilation valve 822, and vacuum indicator 823. Having a plurality of vacuum chambers 829 is intended to provide an enhanced grip on the part. For example, if a part is broken into pieces, some of the plurality of vacuum chambers 829 may be able to hold the pieces of the part to avoid further breakage or the pieces of the part falling off of the pallet 830. Further, where vacuum pressure is lost in one vacuum chamber 829, the other vacuum chamber 829 continues to provide vacuum pressure to the part. In a further example, where the pallet 830 is carrying multiple parts, each vacuum chamber 829 may be dedicated to a single part.

FIGS. 17A to 17C illustrate the pallet 830 in a top perspective view, top view, side view, respectively. In this embodiment, the pallet 830 includes a pallet body 831, a support plate 833, and a pallet frame 835. The pallet 830 includes at least one vacuum gripper 832 (as best illustrated in FIG. 17D). As illustrated in this example, the pallet 830 comprises six vacuum grippers 832. The pallet 830 may comprise any appropriate number of vacuum grippers 832 depending on the application.

Each vacuum gripper 832 is connected to the vacuum assembly 820 such that vacuum pressure is provided to the vacuum gripper 832 from the vacuum assembly 820. It will be understood that "connected" in this context means there is a path between the vacuum gripper 832 and the vacuum assembly 820. For example, here the vacuum gripper 832 is connected via a vacuum pipe 842 to a conduit (such as the pneumatic hose 828 of FIG. 16) that is connected to the vacuum chamber 829. This is sometimes referred to as "fluidly" connected. The arrows 843 of FIGS. 17B and 17C indicate the direction of evacuated air from the vacuum pipes 842.

FIGS. 18A to 18B illustrate details of the vacuum indicator 823. In this embodiment, the vacuum indicator 823 is located in the vacuum chamber cover 824. The vacuum indicator 823 is configured to extend (be visible) if the vacuum chamber 829 has not achieved a predetermined level of vacuum pressure (as illustrated in FIG. 18A). If the vacuum chamber 829 has achieved the predetermined level of vacuum pressure, the vacuum indicator 823 does not extend (is not visible) over the vacuum chamber cover 824 (as illustrated in FIG. 18B).

The vacuum indicator 823 indicates if the vacuum assembly 820 has lost vacuum. This can be important because if the vacuum is lost during operation, the position of the part on the pallet 830 may no longer be known. Where the vacuum indicator 823 indicates a loss of vacuum pressure, the part on the pallet 830 may be declared as failed for quality purposes because the quality may not be known if the part was processed with an unacceptable vacuum pressure.

The position of the vacuum indicator 823 is monitored by an indicator sensor 836. The indicator sensor 836 may be, for example, an optical sensor or an inductive sensor. Where the sensor 836 registers that the vacuum indicator 823 is extended/visible (as illustrated in FIG. 18A), the vacuum chamber 829 is determined to have not achieved the predetermined level of vacuum pressure. Where the sensor 836 registers that the vacuum indicator 823 is not extended/visible (as illustrated in FIG. 18B), the vacuum chamber 829 is determined to have achieved the predetermined level of vacuum pressure.

FIG. 18C illustrates the vacuum indicator 823. The vacuum indicator 823 includes a bolt 838 through a rubber membrane 839. FIG. 18D illustrates a graph of the bolt extension (I) relative to the pressure of the vacuum chamber 829. Where the vacuum chamber 829 is at a maximum vacuum pressure ($P_0$) the bolt 838 is not extended beyond the surface of the vacuum chamber cover 824. Where the vacuum chamber 829 is at a normal pressure ($P_n$) or atmospheric pressure the bolt 838 is extended beyond the surface of the vacuum chamber cover 824. In some cases, the bolt 838 extends linearly relative to the pressure of the vacuum chamber 829.

In other cases, the vacuum indicator 823 may be a pressure sensor (not shown) that is provided to the vacuum chamber 829. The pressure sensor detects the relative pressure of the vacuum chamber 829 and indicates an unacceptable vacuum pressure in the vacuum chamber 829. The pressure sensor may be powered by power transferred to the moving element 850.

In some cases, the sensor 836 or the pressure sensor triggers an alert for an operator. In another further case, the sensor 836 or pressure sensor activates a vacuum source to increase the vacuum pressure in the vacuum chamber 829.

The vacuum system 800 is supplied power and/or vacuum pressure in one or more alternative systems.

Figure 19:
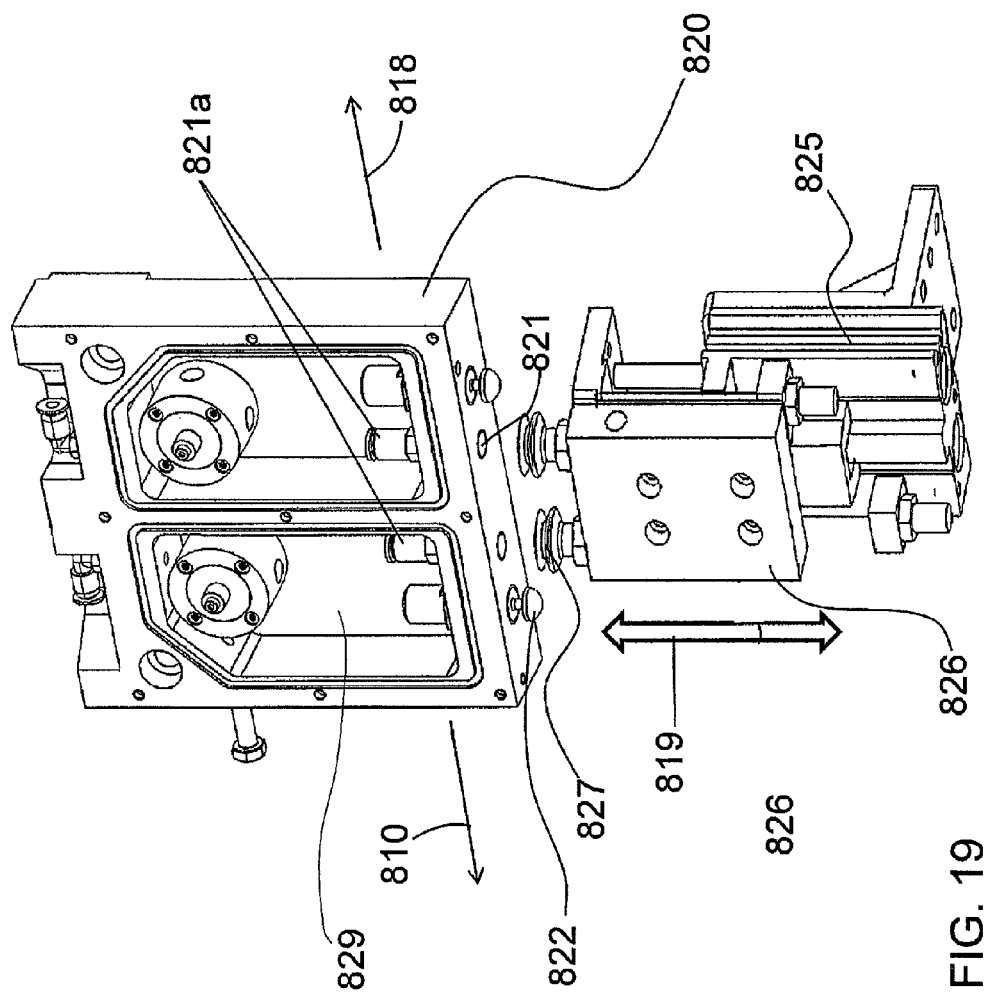
FIG. 19 illustrates a vacuum component of the embodiment of FIG. 14 together with a connector unit.

FIG. 19 illustrates the vacuum assembly 820 in a position to be connected with a connector unit 825. The connector unit 825 supplies vacuum pressure to the vacuum assembly 820. The connector unit 825 includes at least one connector module 826 for connecting to the connection valve 821 of the vacuum assembly 820. The connector module 826 includes at least one bellows connector 827. The bellows connector 827 is configured to establish a substantially airtight connection with the connection valve 821 in order to evacuate the vacuum chamber 829. The connector module 826 is operable to move into and out of connection with the vacuum assembly 820 in a direction 819.

The connector module 826 is configured to move into contact with the vacuum assembly 820 as a part is loaded to the pallet 830. The connector module 826 may be provided, for example, at a part loading station or a workstation or at other appropriate places within the transport system where the moving element 850 stops moving. The bellows connector 827 is configured to establish a substantially airtight connection with the connection valve 821 of the vacuum assembly 820 as the vacuum chamber 829 is evacuated. In the present embodiments, the connector module 826 is at a set position along the track (i.e. does not move together with the moving element 850) but there may be embodiments where the connector module 826 may be re-positioned along the transport system at various to engage with moving element 850 to charge the vacuum assembly 820 at predetermined positions. The connector module 826 will generally be supplied vacuum pressure by a vacuum source via a conventional pressure system external to the transport system.

Once the part is loaded and the vacuum pressure is supplied, the connector module 826 is moved away from the vacuum assembly 820. The moving element 850 including the part is then free to move along the track (not shown in FIG. 19) in directions 810, 818. The vacuum pressure may be maintained by the back pressure valves 821a.

When processing of a part on the pallet 830 is completed, the vacuum pressure may be released by actuating the ventilation valves 822. The knobs 822a of the ventilation valves 822 may be actuated mechanically, such as, by pushing the knobs 822a to release the vacuum pressure from the vacuum chambers 829 and thus releasing the part.

Figure 20:
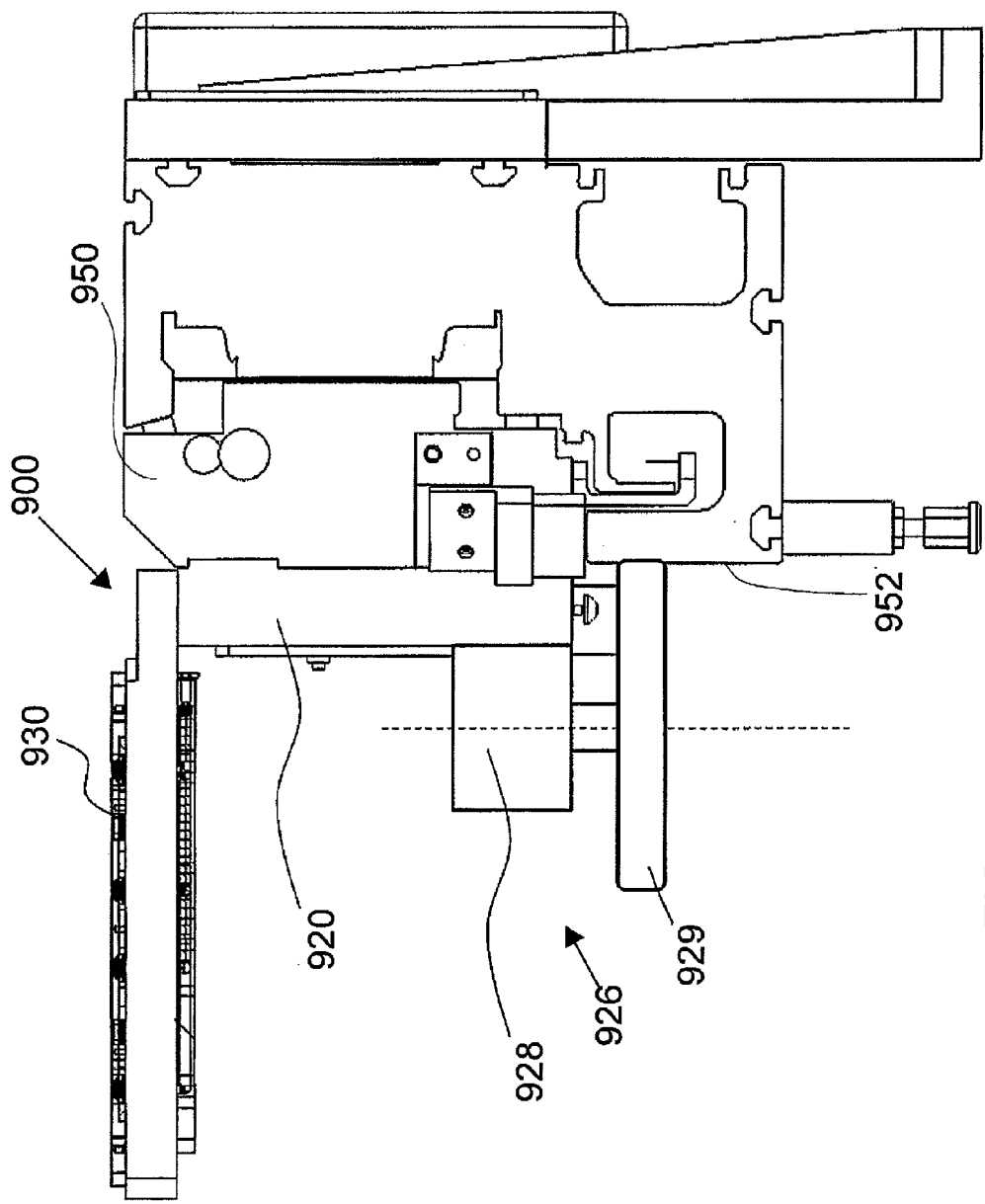
FIG. 20 illustrates another embodiment of a moving element/pallet having a vacuum system.
Figure 21:
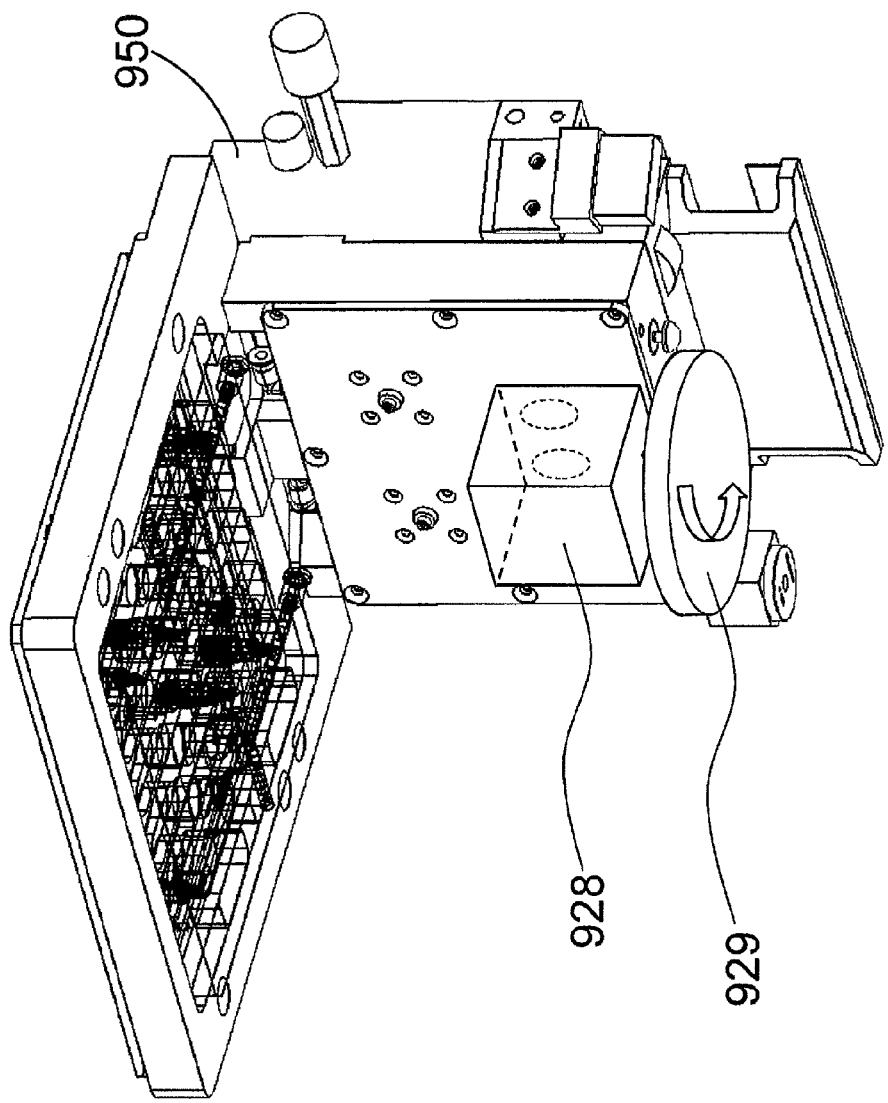
FIG. 21 illustrates a bottom perspective view of the embodiment of FIG. 20.

FIGS. 20 and 21 illustrate an embodiment of a vacuum system 900. In this embodiment, the vacuum system 900 includes a vacuum component 920 similar to the vacuum assembly 820 of FIGS. 14 to 19 but further comprises a vacuum source 926. The vacuum source 926 includes a vacuum pump 928 and a friction wheel 929. The vacuum pump 928 may be mounted to the vacuum component 920 of a moving element 950. The vacuum pump 928 supplies vacuum pressure to a pallet 930 via the vacuum component 920.

During movement of the moving element 950, the friction wheel 929 contacts a frame 952 of a track section 35 (as illustrated in FIG. 20) to generate mechanical energy and drive the vacuum pump 928. The rotation of the friction wheel 929 on the track 35 evacuates the vacuum component 920 by turning the friction wheel 929. The friction wheel 929 may continue to draw through a one way valve.

In an embodiment, the vacuum component 920 may be provided with vacuum pressure at a loading device, for example when connected to a connector unit 825 and the vacuum pump driven by the fiction wheel may only compensate for loss of vacuum. In this embodiment, the connector unit 825 and the vacuum component 920 are configured such that both systems may be operated.

Figure 22:
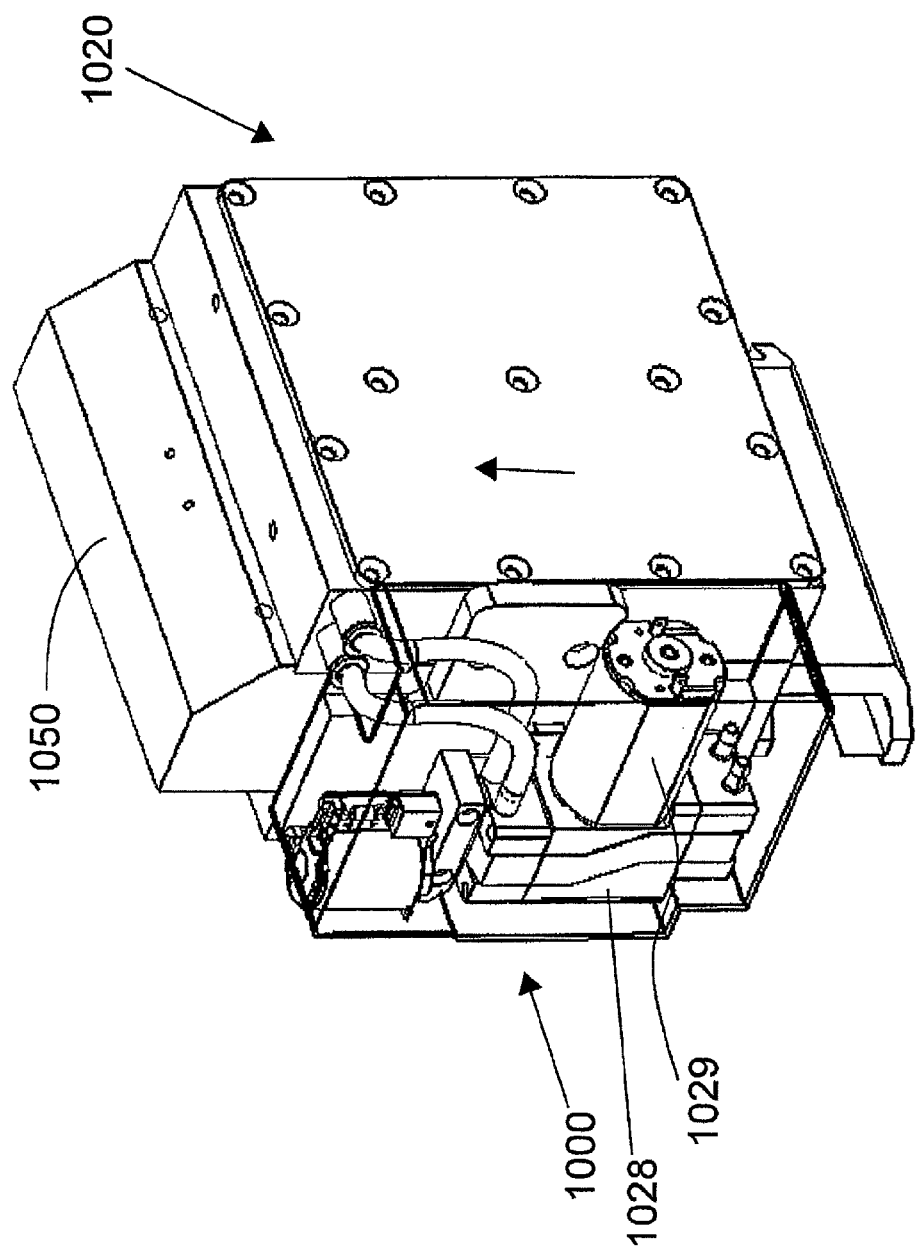
FIG. 22 illustrates yet another embodiment of a moving element/pallet having a vacuum system.

FIG. 22 illustrates a further embodiment of a vacuum system 1000. In this embodiment, the vacuum system 1000 includes a vacuum pump 1028, an electrical motor 1029 and a vacuum assembly 1020. The electrical motor 1029 uses electrical energy to drive the vacuum pump 1028 to provide vacuum pressure to vacuum assembly 1020. The electrical motor 1029 is supplied by electrical power from an electrical power source, for example, stored electricity (for example, batteries), via induction between a moving element 1050 and a track section (as described above), or from a direct electrical connection to a power source (such as through contact pins) during a stop at a workstation.

The vacuum pump 1028 can be considered to replace the vacuum pump 928 (illustrated in FIGS. 20 and 21). Alternatively, the vacuum pump 1028 and electrical motor 1029 can be considered to replace the vacuum connector 826 (illustrated in FIG. 19).

Figure 23A:
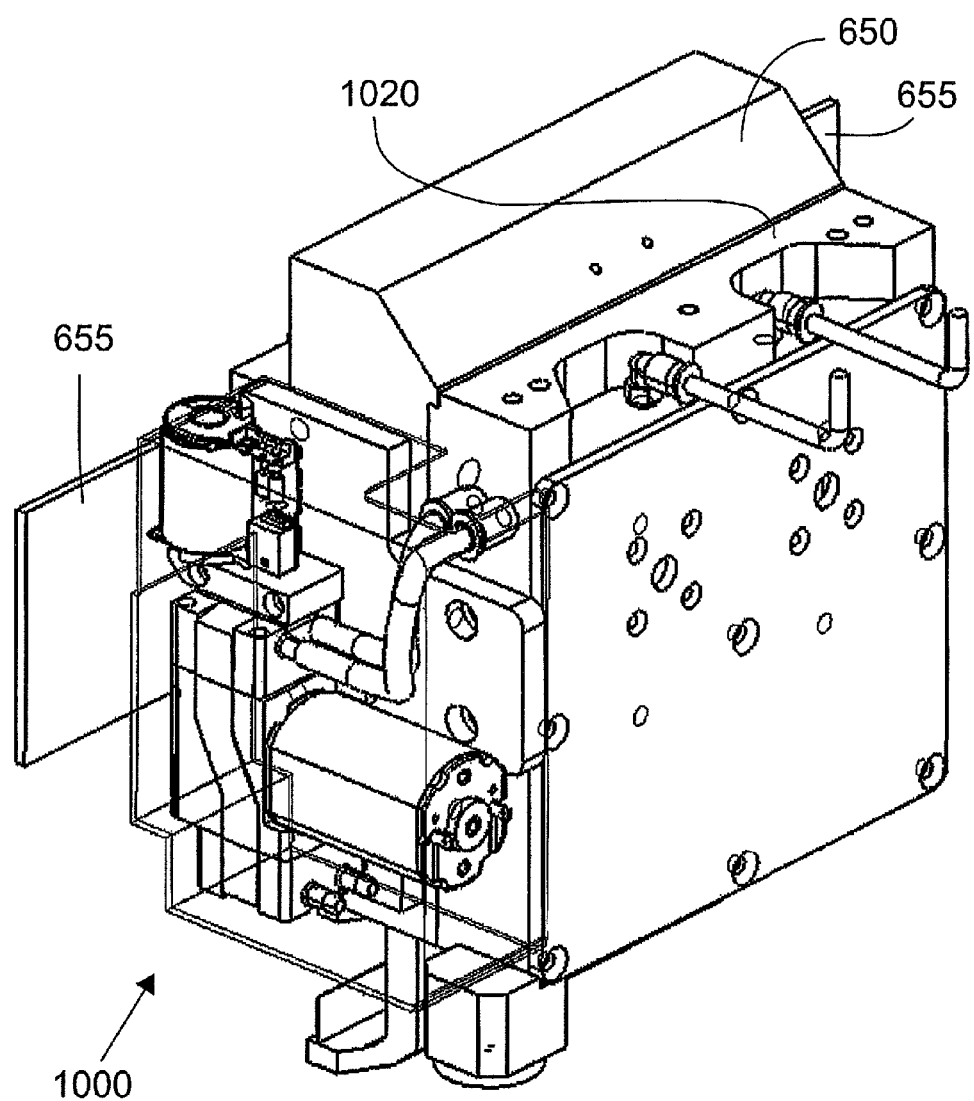
Figure 23B:
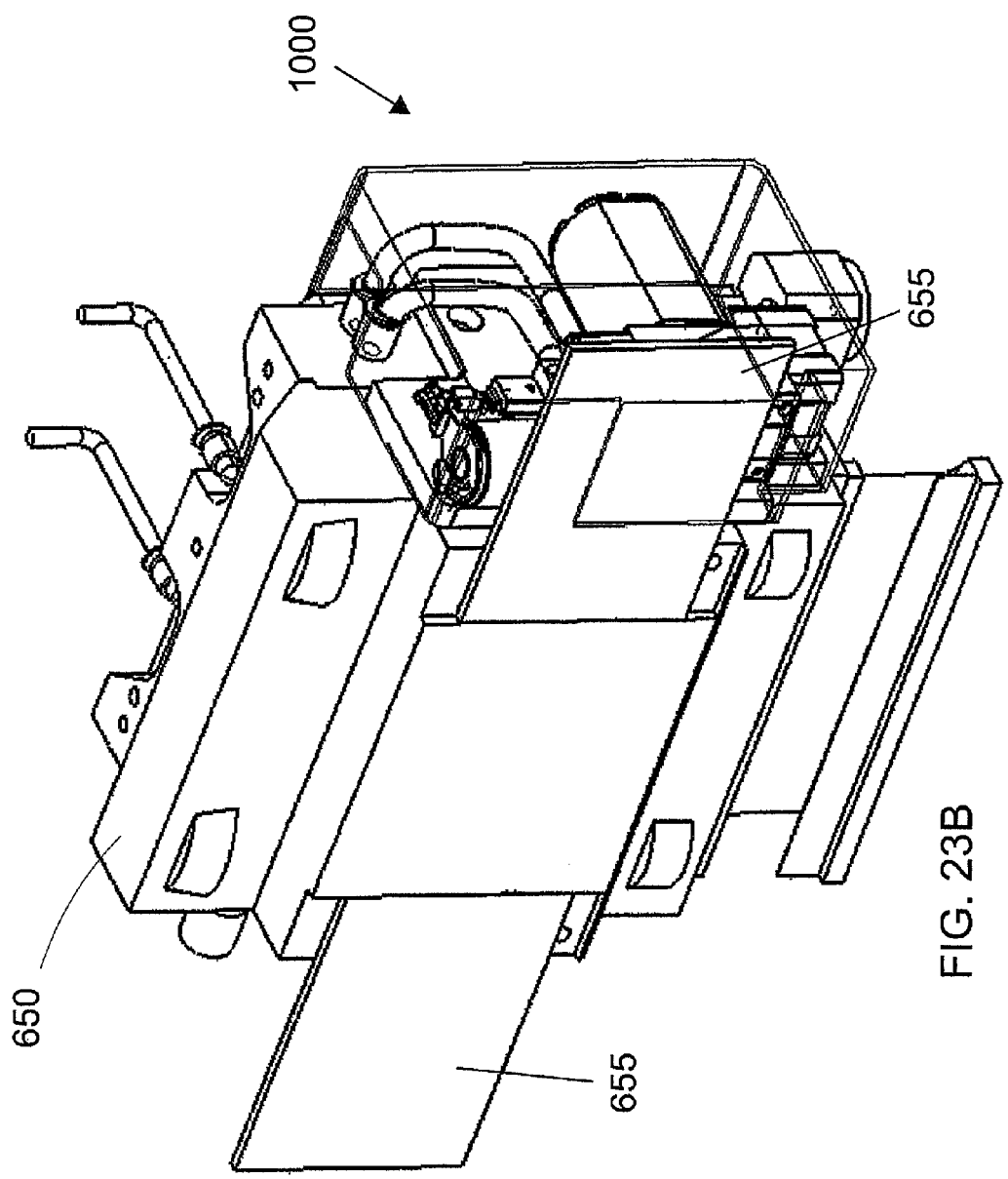

FIGS. 23A and 23D illustrate a perspective front view and a front view of the vacuum system 1000 incorporated with the moving element 650 (as illustrated in FIG. 7). FIGS. 23B and 23C illustrate a perspective back and a back view of the vacuum system 1000. The vacuum system 1000 includes at least one induction panel 655. The induction panels 655 are arranged to receive power transfer from the linear motor coils 105 (illustrated in FIG. 7). The power received from the linear motor coils 105 provides power to the vacuum system 1000 in order to provide vacuum pressure to the vacuum assembly 1020.

An advantage with the vacuum source or vacuum pump combined with power transfer to the moving element is that the vacuum system can run independently of the motion of the moving element and allows the pallet to have vacuum available at all times. In conventional systems there may be some leakage and may be a certain amount of time until the vacuum in the chamber drops below the point the part is held reliably. In a conventional system, if the pallet is not at a vacuum recharge station, the system may lose accurate control of the part. In the present system, with the ability to provide power to the pallet, the pump can be switched on at anytime and anywhere the vacuum drops below a given level.

In some situations, in particular where the vacuum source is on the moving element and provided with power even while moving, vacuum can be provided to the outlets/grippers in a continuous manner and it may be possible to do without the vacuum chamber for storing vacuum.

Figure 24:
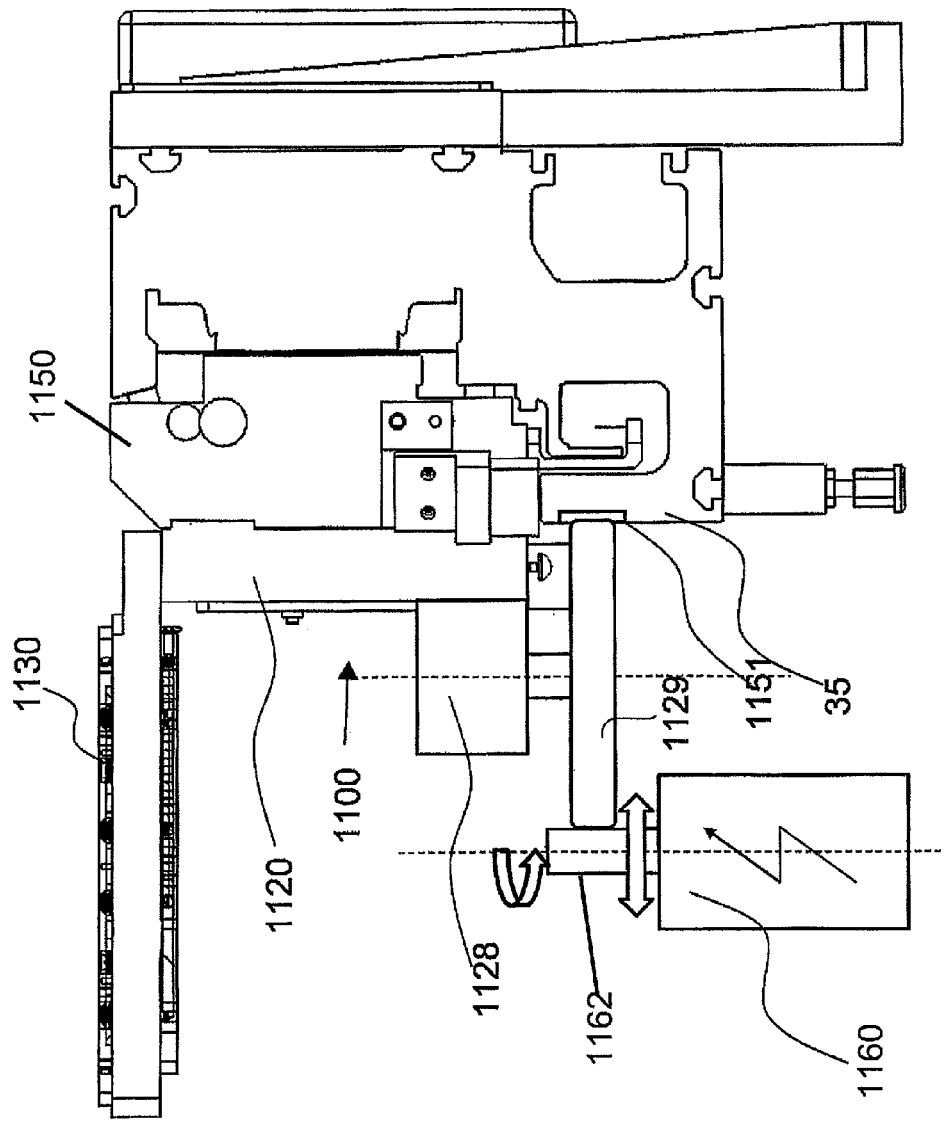
FIG. 24 illustrates yet another embodiment of a moving element/pallet having a vacuum system.

FIG. 24 illustrates a vacuum system 1100. In this embodiment, the vacuum system 1100 includes a vacuum pump 1128, a friction wheel 1129, and a vacuum assembly 1120 similar to vacuum system 900. However, the vacuum system 1100 has been configured such that it does not require a connector unit 825 to supply vacuum pressure when the friction wheel 1129 is not rotating (such as when the moving element 1150 is stopped at a workstation).

When the vacuum system 900 is stationary, an electric drive 1160 rotates a friction gear 1162 which rotates the friction wheel 1129, providing vacuum pressure to the vacuum assembly 1120 and pallet 1130. For example, when a part is placed on the pallet 1130, the electric drive 1160 is activated in order to provide vacuum pressure to the pallet 1130. In this case, the track 35 location where the electric drive 1160 is activated has a recess 1151. The recess 1151 provides clearance to allow the friction wheel 1129 to rotate via the electric drive 1160 without contacting the track section 35. In this way, vacuum can be provided, maintained or re-charged even when the moving element 1150 is stationary.

Figure 25A:
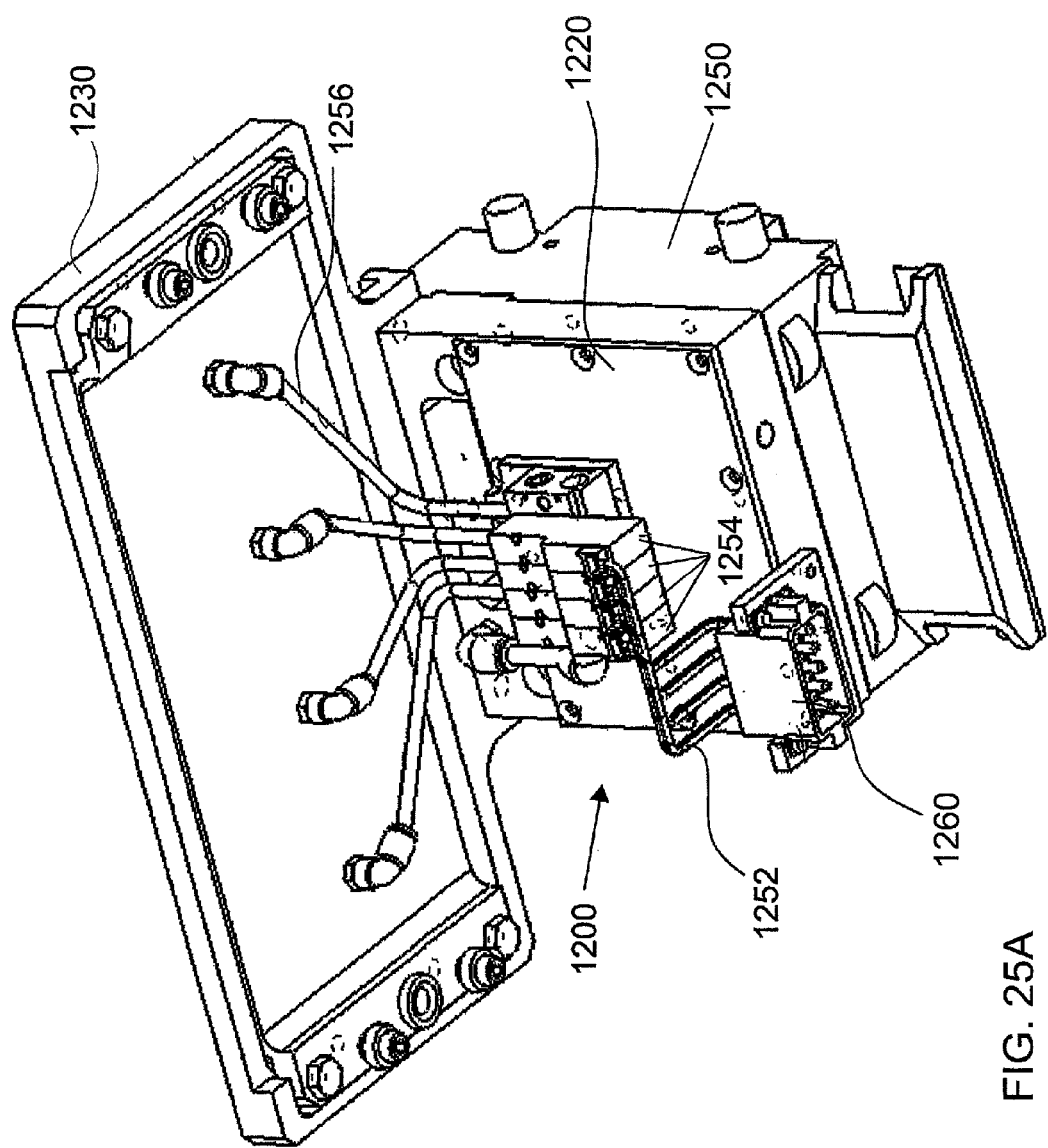
FIG. 25A to 25C illustrate yet another embodiment of a moving element/pallet having a vacuum system.
Figure 25B:
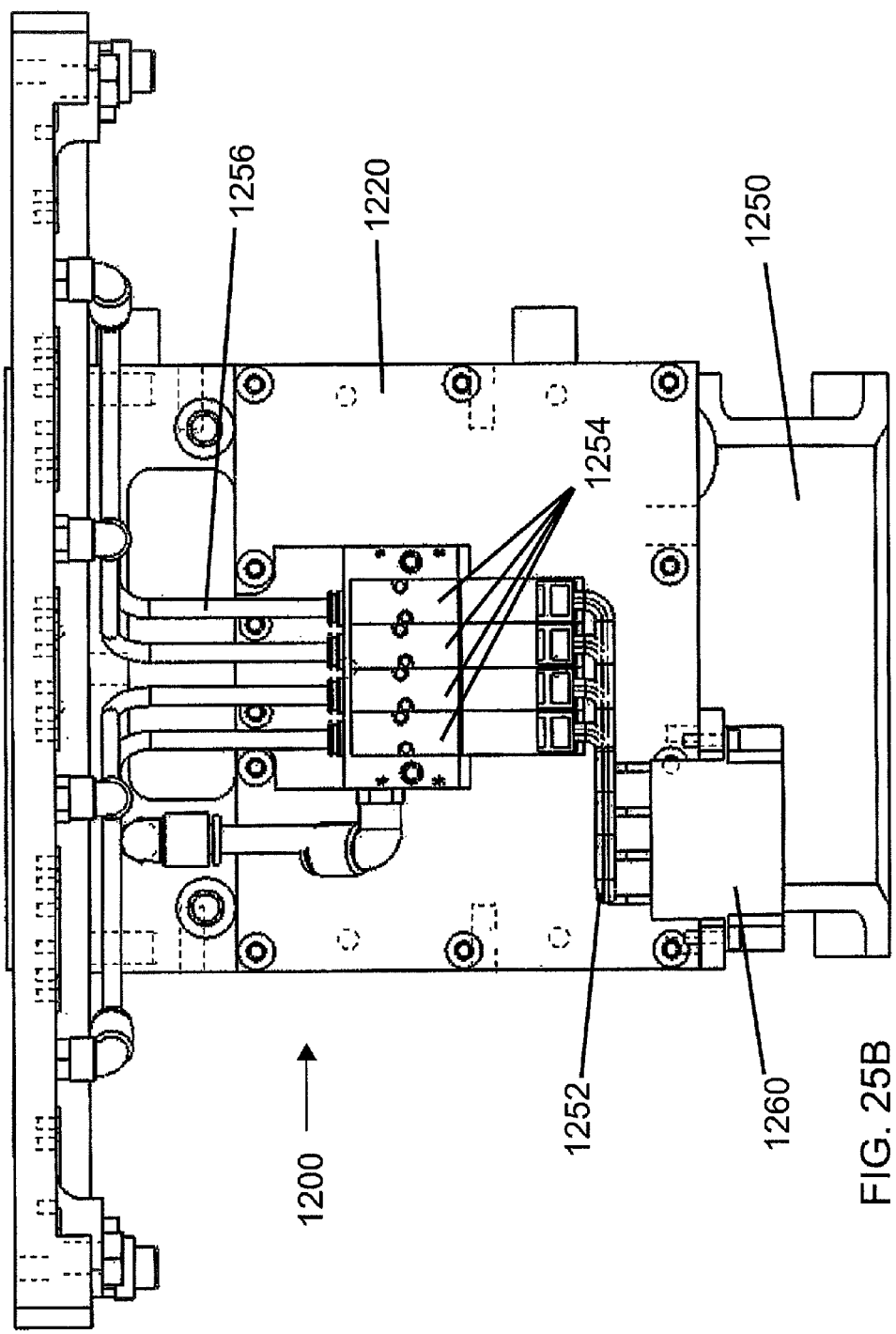
Figure 25C:
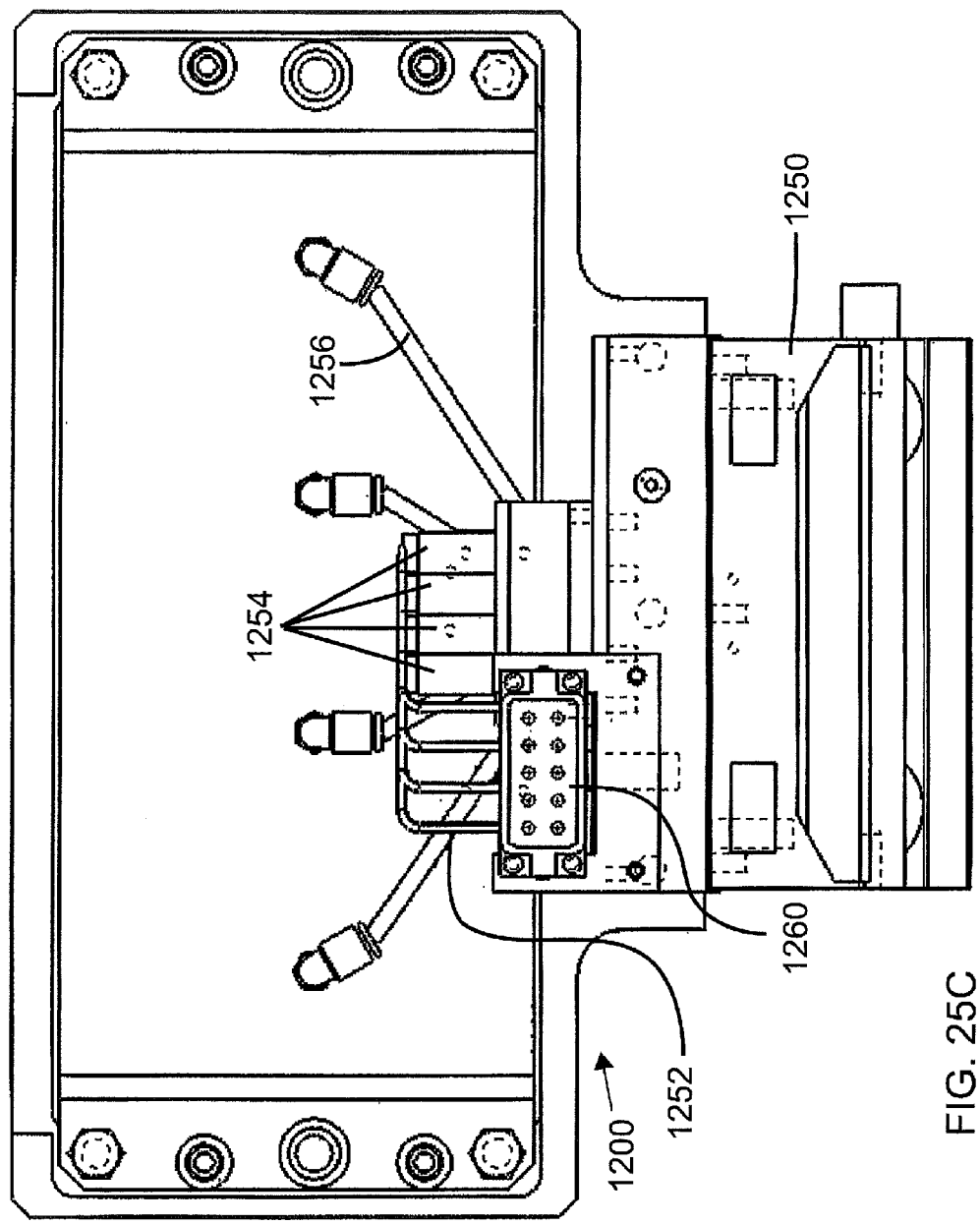

FIGS. 25A to 25C illustrate a vacuum system 1200. In this embodiment, the vacuum system 1200 is intended to provide high speed, independent control, and flexibility for providing vacuum pressure to multiple grippers. In this example, the vacuum system 1200 includes a vacuum assembly 1220 that is pre-charged with vacuum pressure by, for example, one of vacuum systems 900, 1000, and 1100, modified as necessary.

The vacuum system 1200 also includes one or more pneumatic valves 1254 and a vacuum controller 1260 that controls the pneumatic valves 1254. The pneumatic valves 1254 control the provision of vacuum to the vacuum outlets (not shown) on the pallet 1230 via a corresponding conduit 1256, such as a pneumatic hose. In some cases, there may be one pneumatic valve 1254 per outlet (for example four valves for 4 outlets as illustrated in FIGS. 25A to 25C) but other combinations can also be considered.

When a pallet 1230 arrives at a workstation, the vacuum controller 1260 mates with a corresponding workstation vacuum controller (not shown) such that signals can be transmitted to control the pneumatic valves 1254. The connection may also provide electrical power in some cases. In the illustrated example, the vacuum controller 1260 is connected to the pneumatic valves 1254 via wires 1252. It will be understood that the vacuum controller 1260 may alternatively be another location such as the pallet 1230 or moving element 1250 or the like. In this embodiment, the vacuum controller 1260 mates with a workstation vacuum controller to pass control signals, however, it will be understood that the vacuum controller 1260 could be provided control signals wirelessly or using other communications channels or approaches.

The vacuum system 1200 with pneumatic valves 1254 and vacuum controller 1260 provides for flexible and independent control of the outlets or sets of outlets depending on the configuration. In some cases, the vacuum assembly 1220 may be provided with a number of vacuum chambers associated with each valve, although this is not required.

When a part (not shown) is being loaded on the pallet 1230, the appropriate pneumatic valve 1254 can be switched on such that vacuum is independently supplied to an appropriate outlet (for example, a gripper) on the pallet 1230. This method of independently switching is intended to provide for faster part hand-off. The independent control also be used for situations involving more than one part on a pallet. Individual parts can be placed separately placed and gripped independently. A similar sequence could be followed to switch off the vacuum pressure as the parts are unloaded. Independent control is intended to allow for conservation of vacuum at the vacuum assembly 1220.

In this example, power induced on the pallet (as illustrated in FIGS. 23A to 23D) can also be used as a power source for the valves 1254 and vacuum controller 1260, where needed.

As will be apparent from the system descriptions above, a method of providing a vacuum on a moving pallet involves providing a vacuum chamber that moves with the pallet and then providing the equipment required to evacuate/charge the vacuum chamber to create the vacuum. The evacuation of the vacuum chamber may include: periodically evacuating the vacuum chamber when the pallet is stopped, evacuating the vacuum chamber using a vacuum source operated by mechanical means; evacuating the vacuum chamber using a vacuum source operated by electricity. In the later case, the electricity may be supplied by inductive power transferred to the pallet.

Although the field of application described herein relates to vacuum gripping of parts, and in particular fragile parts, such as the situation in solar cell processing, the vacuum system may have many applications. Possible applications include but are not limited to: solar cell processing, printing of cells, processing of foils, fuel cell stack processing & assembly, lithium Ion battery assembly, tablet PC touch screen assembly or processing, and smartphone touch screen assembly. The vacuum systems and methods described herein may also be applied to extended systems with pallets following flexible routing patterns.

In the preceding description, for purposes of explanation, numerous details are set forth in order to provide a thorough understanding of the embodiments. However, it will be apparent to one skilled in the art that these specific details may not be required. In other instances, well-known structures and circuits are shown in block diagram form in order not to obscure the understanding. For example, specific details are not provided as to whether the embodiments or elements thereof described herein are implemented as a software routine, hardware circuit, firmware, or a combination thereof.

Embodiments of the disclosure or elements thereof can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method for providing vacuum on a moving element of a transport system, the method comprising:
    providing a vacuum pump on the moving element, the vacuum pump comprising a vacuum outlet configured to provide vacuum to an object on the moving element;
    providing a vacuum inlet on at least one vacuum chamber for connection to the vacuum pump;
    driving the vacuum pump to generate vacuum directly by energy generated by interaction between the moving element and the transport system,
    storing the vacuum in the at least one vacuum chamber provided on the moving element and between the vacuum pump and the object and recharging the at least one vacuum chamber;
    wherein the vacuum pump is driven while the moving element is in motion on the transport system, and
    the energy generated to drive the vacuum pump is used to drive the vacuum pump without the energy generated being stored in a battery between the time of generation and the time of driving the vacuum pump.

2. A method according to claim 1, wherein the object on the moving element comprises a vacuum gripper and the method further comprises periodically operating the vacuum pump to engage the vacuum gripper.

3. A method according to claim 1, wherein the driving the vacuum pump directly by energy generated by interaction between the moving element and the transport system comprises driving the vacuum pump via electromagnetic induction between the moving element and the transport system.

4. A method according to claim 1, wherein the driving the vacuum pump directly by energy generated by interaction between the moving element and the transport system comprises driving the vacuum pump with mechanical energy.

5. A method according to claim 4, wherein the driving the vacuum pump with mechanical energy comprises engaging a friction wheel on the moving element with the transport system to generate the mechanical energy.

* * * * *